United States Patent
Takeda et al.

(10) Patent No.: US 10,224,969 B2
(45) Date of Patent: Mar. 5, 2019

(54) TRANSMITTER CIRCUIT, SEMICONDUCTOR APPARATUS AND DATA TRANSMISSION METHOD

(71) Applicant: RENESAS ELECTRONICS CORPORATION, Tokyo (JP)

(72) Inventors: Koichi Takeda, Tokyo (JP); Hirokazu Nagase, Tokyo (JP); Shinpei Watanabe, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/727,968

(22) Filed: Oct. 9, 2017

(65) Prior Publication Data

US 2018/0041233 A1    Feb. 8, 2018

Related U.S. Application Data

(63) Continuation of application No. 15/066,900, filed on Mar. 10, 2016, now Pat. No. 9,813,084.

(30) Foreign Application Priority Data

Mar. 17, 2015  (JP) .................................. 2015-053444
Sep. 14, 2015  (JP) .................................. 2015-180395

(51) Int. Cl.
  *H04B 1/04*   (2006.01)
  *H04L 25/02*  (2006.01)
  (Continued)

(52) U.S. Cl.
  CPC .............. *H04B 1/04* (2013.01); *H01L 23/60* (2013.01); *H04B 1/40* (2013.01); *H04L 25/0266* (2013.01);
  (Continued)

(58) Field of Classification Search
  CPC ... H04L 25/0266; H04L 1/0041; H01L 23/60; H04B 1/04; H04B 1/40; H04B 5/0012; H04B 5/0075; H04B 5/0081
  See application file for complete search history.

(56) References Cited

U.S. PATENT DOCUMENTS 5,952,849 A     9/1999  Haigh
7,102,862 B1 *  9/2006  Lien ..................... H01L 27/0285
                                                361/56
(Continued)

FOREIGN PATENT DOCUMENTS

EP    0749227 A2    12/1996
JP    56-037550 U    4/1981
(Continued)

OTHER PUBLICATIONS

Extended European Search Report issued in corresponding EP Application No. 16158887.6, dated Jul. 20, 2016.
(Continued)

*Primary Examiner* — Sophia Vlahos
(74) *Attorney, Agent, or Firm* — McDermott Will & Emery LLP

(57) ABSTRACT

The transmitter circuit according to one embodiment includes a pulse generating circuit generating a pulse signal based on edges of input data, a first output driver outputting, based on the pulse signal, a first output pulse signal according to one of the edges to a first end of an external insulating coupling element, a second output driver outputting, based on the pulse signal, a second output pulse signal according to other one of the edges to a second end of the insulating coupling element, and an output stop circuit stopping the first and second output pulse signals from being output for a prescribed period from when a power supply voltage is turned on.

3 Claims, 23 Drawing Sheets

(51) Int. Cl.
*H01L 23/60* (2006.01)
*H04B 1/40* (2015.01)
*H04B 5/00* (2006.01)
*H04L 1/00* (2006.01)

(52) U.S. Cl.
CPC .. *H01L 2924/16152* (2013.01); *H04B 5/0012* (2013.01); *H04B 5/0075* (2013.01); *H04B 5/0081* (2013.01); *H04L 1/0041* (2013.01)

(56) References Cited

U.S. PATENT DOCUMENTS

| | | | |
|---|---|---|---|
| 7,158,142 B1 * | 1/2007 | Fukuda | G02F 1/13306 345/581 |
| 2005/0001660 A1 | 1/2005 | Roy | |
| 2005/0018370 A1 | 1/2005 | Arai et al. | |
| 2006/0028777 A1 * | 2/2006 | Chung | G11C 17/16 361/56 |
| 2007/0091524 A1 | 4/2007 | Davis | |
| 2007/0097568 A1 * | 5/2007 | Miske | H01L 27/0285 361/56 |
| 2009/0122904 A1 | 5/2009 | Jang et al. | |
| 2010/0149701 A1 | 6/2010 | Drapkin et al. | |
| 2010/0296212 A1 * | 11/2010 | Liang | H01L 27/0285 361/56 |
| 2012/0307410 A1 | 12/2012 | Yamazaki et al. | |
| 2013/0285465 A1 | 10/2013 | Takeda et al. | |
| 2013/0286517 A1 | 10/2013 | Tian | |
| 2013/0287141 A1 | 10/2013 | Kaeriyama | |

FOREIGN PATENT DOCUMENTS

| | | |
|---|---|---|
| JP | 2004-260648 A | 9/2004 |
| JP | 2005-045100 A | 2/2005 |
| JP | 4750746 B2 | 8/2011 |
| JP | 2012-253241 A | 12/2012 |
| JP | 2013-229812 A | 11/2013 |
| JP | 2013-229815 A | 11/2013 |
| WO | 9837672 A1 | 8/1998 |

OTHER PUBLICATIONS

Non-final Office Action issued in related U.S. Appl. No. 15/066,900, dated Sep. 29, 2016.
Final Office Action issued in related U.S. Appl. No. 15/066,900, dated Mar. 22, 2017.
Notice of Allowance issued in related U.S. Appl. No. 15/066,900, dated Jul. 6, 2017.
Japanese Office Action issued in corresponding Japanese Patent Application No. 2015-180395, dated Jan. 8, 2019, with English Translation.

* cited by examiner

TRANSMITTER CIRCUIT, SEMICONDUCTOR APPARATUS AND DATA TRANSMISSION METHOD

CROSS-REFERENCE TO RELATED APPLICATIONS

This application is a continuation of U.S. patent application Ser. No. 15/066,900, filed Mar. 10, 2016, which claims the benefit of priority from Japanese patent application No. 2015-053444, filed on Mar. 17, 2015 and Japanese patent application No. 2015-180395, filed on Sep. 14, 2015, the disclosures of which are incorporated herein in its entirety by reference.

BACKGROUND

Field of the Invention

The present invention relates to a transmitter circuit, a semiconductor apparatus, and data transmission method.

Related Art

In a case where signals are exchanged between a plurality of semiconductor chips differing from each other in power supply voltage, the semiconductor chips must be electrically insulated from each other with insulating coupling elements in exchanging signals. Known insulating coupling elements include an AC coupling element using capacitors, coils and the like, and an optical coupling element (a photocoupler). Japanese Unexamined Patent Application Publication No. 2013-229812 discloses a semiconductor apparatus which exchanges signals using coils as insulating coupling elements, that is, what is called a micro-isolator.

In the disclosure of Japanese Unexamined Patent Application Publication No. 2013-229812, a pulse signal triggered by the edges of a data signal is transmitted from a transmitter circuit. Here, from the transmitter circuit, a pulse signal capable of distinguishing between the rising edge and the falling edge of the data signal is transmitted. Therefore, the data signal can be reconstructed at a receiver circuit.

Meanwhile, Japanese Unexamined Patent Application Publication Nos. 2005-045100 and 2012-253241 and Japanese Patent No. 4750746 each disclose an electrostatic discharge protection circuit provided between the power supply and the ground. The electrostatic discharge protection circuit is mounted for protecting the internal circuitry of a semiconductor apparatus from high voltage pulses generated by electrostatic discharge. The electrostatic discharge protection circuit disclosed in Japanese Unexamined Patent Application Publication Nos. 2005-045100 and 2012-253241 turns on an NMOS transistor upon sensing a sharp increase in the power supply. The electrostatic discharge protection circuit (GGNMOS: Gate Grounded NMOS) disclosed in Japanese Patent No. 4750746 turns on a parasitic bipolar of an NMOS transistor when a power supply potential of a certain level is reached. By the foregoing operations, each electrostatic discharge protection circuit operates before the power supply potential reaches the breakdown voltage of the internal circuitry. Thus, an increase in the power supply voltage is suppressed and the internal circuitry is protected.

SUMMARY

The inventors have found the following problem.

For example, it has been found that, when the HBM (Human Body Model) test being one of electrostatic discharge damage tests is conducted with a micro-isolator such as disclosed in Japanese Unexamined Patent Application Publication No. 2013-229812, failure such as a breakdown of the transmitter circuit or a break of the insulating coupling element may occur. It has been found that, application of surge current causes the power supply voltage to exceed a specified voltage and the transmitter circuit to output erroneous pulses, which eventually invite the foregoing failure.

High-speed operability, low power consumption, small area occupancy, and noise immunity are important performance indexes of a micro-isolator. One scheme for improving them is to cause large current to flow in a short time period from a transmitter circuit to a transformer being an insulating coupling element. For example, the transmitter circuit in the micro-isolator disclosed in Japanese Unexamined Patent Application Publication No. 2013-229812 is structured by a pulse generating unit outputting short pulses and an output driver unit having high drive performance. On the other hand, the pulse generating unit is associated with a problem that, immediately after the power supply is turned on, the state of internal nodes in a delay element structuring the pulse generating unit is unstable, and whereby the pulse generating unit tends to output erroneous pulses. Further, the output driver unit is designed to cause normally a current of, for example, 100 mA to flow through the transformer at a specified voltage (for example, 5 V). Here, the output driver unit is associated with a problem that, when the power supply voltage being largely higher than the specified voltage is applied, current greater than a permissible value flows through the driver or the transformer when operated.

While the constituent elements are respectively associated with problems, normally two problems do not simultaneously occur and hence no challenges are posed. However, when the HBM test is conducted between the power supply and the ground, the state where the power supply is turned on at a voltage largely higher than the specified voltage (for example, ten-odd V) is entered. Then, during the pulse generating unit generates erroneous pulses, current greater than a permissible value (for example, several hundred mA) flows through the driver or the transformer, resulting in failure such as a breakdown of the transmitter circuit or a break of the insulating coupling element.

With the electrostatic discharge protection circuits disclosed in Japanese Unexamined Patent Application Publication Nos. 2005-045100 and 2012-253241 and Japanese Patent No. 4750746, while an increase in the power supply voltage attributed to application of surge current can be suppressed to be lower than the breakdown voltage (for example, ten-odd V), it is difficult to suppress the surge current to approximate the specified voltage (for example, 5 V). Further, it is not possible to prevent the pulse generating unit structuring the transmitter circuit from outputting erroneous pulses. Therefore, as a result, the supply voltage higher than the specified voltage is conveyed to the driver and the transformer by the erroneous pulses, resulting in the failure as described above.

As described above, the conventional electrostatic discharge protection circuits cannot effectively suppress the failure at the electrostatic discharge damage test.

Other problems and novel characteristics will become apparent from the description of the specification and accompanying drawings.

A transmitter circuit according to one embodiment includes an output stop circuit that stops the output of first and second output pulse signals for a prescribed period from when a power supply voltage is turned on.

According to the one embodiment, failure in an electrostatic discharge damage test can be suppressed.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
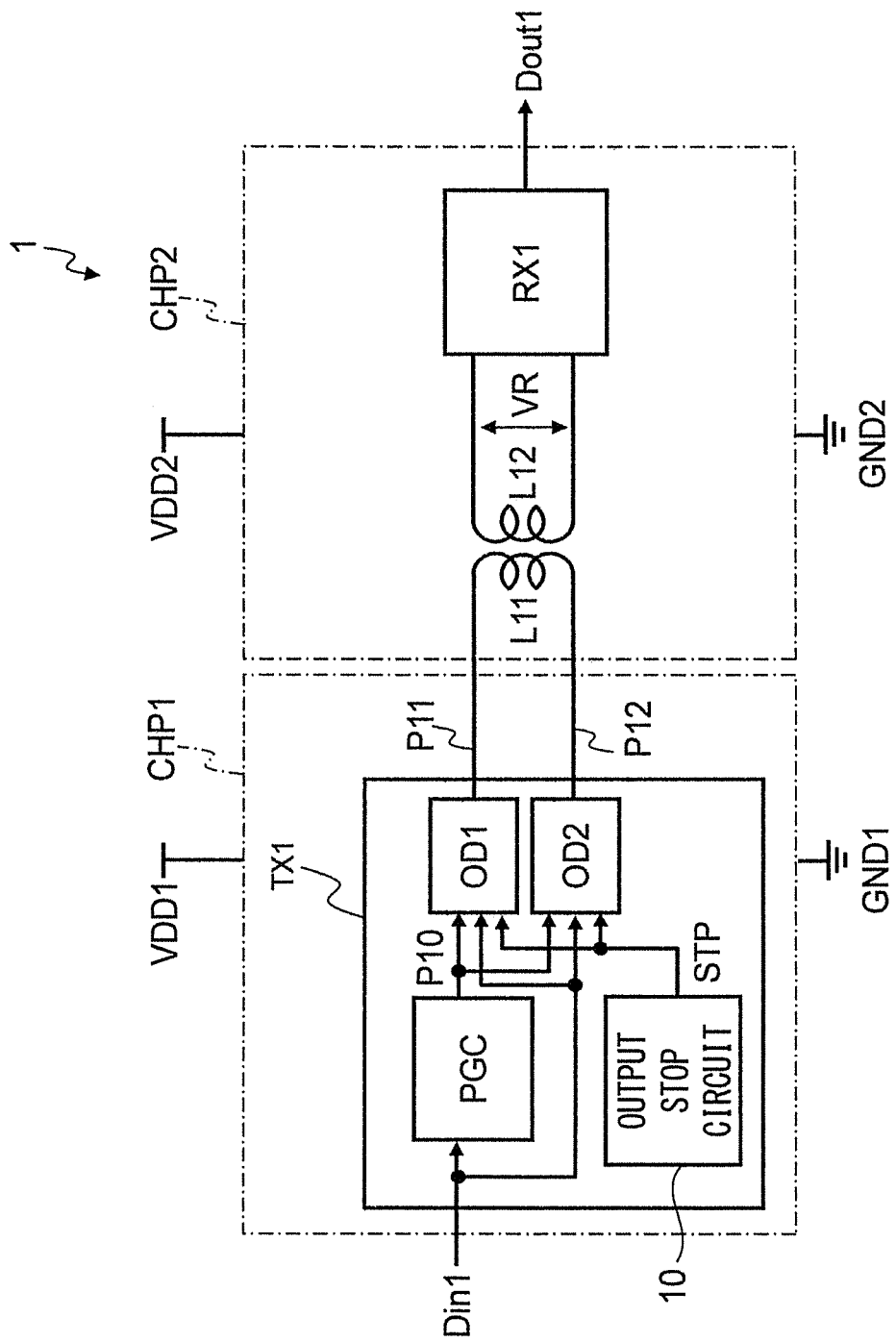
FIG. 1 is a block diagram showing a structure of a semiconductor apparatus according to a first embodiment.

In the following, with reference to the drawings, a detailed description will be given of specific embodiments. Note that, for the sake of clarity of the description, the following description and drawings referred to are omitted or simplified as appropriate. Further, the elements shown in the drawings as functional blocks carrying out various processes can be implemented as hardware by a CPU, memory, and other circuit, and can be realized as software by a program loaded in memory or the like. Accordingly, a person skilled in the art understands that these functional blocks can be realized in various manners, such as solely by hardware, solely software, or by a combination thereof, and the present invention is not limited to one of them. Note that, in the drawings, identical reference characters are allotted to identical elements, and a repetitive description is omitted as necessary.

(First Embodiment)

<Structure of Semiconductor Apparatus 1>

Firstly, with reference to FIG. 1, a description will be given of a semiconductor apparatus according to a first embodiment. FIG. 1 is a block diagram showing the structure of a semiconductor apparatus 1 according to the first embodiment. The semiconductor apparatus 1 according to the first embodiment includes a transmitter circuit TX1, a primary coil L11, a secondary coil L12, and a receiver circuit RX1, and structures a micro-isolator.

The transmitter circuit TX1 is formed at a semiconductor chip CHP1. Note that, the semiconductor chip CHP1 is driven by a first power supply (a power supply voltage VDD1, a ground voltage GND1; a potential difference VDD1−GND1 is, for example, 5 V) belonging to a first power supply system.

The primary coil L11, the secondary coil L12, and the receiver circuit RX1 are formed at a semiconductor chip CHP2. Note that, the semiconductor chip CHP2 is driven by a second power supply (a power supply voltage VDD2, a ground voltage GND2; a potential difference VDD2−GND2 is, for example, 5 V) belonging to a second power supply system being different from the first power supply system.

The primary coil L11 and the secondary coil L12 structure insulating coupling elements which couple two semiconductor chips CHP1, CHP2, which differ in power supply voltage from each other, via magnetic fields or electric fields while electrically insulating the semiconductor chips CHP1, CHP2 from each other. By the insulating coupling elements, data signals can be transmitted from the transmitter circuit TX1 on the semiconductor chip CHP1 to the receiver circuit RX1 on the semiconductor chip CHP2 of a different power supply voltage (the potential difference VDD1−VDD2 is, for example minus several hundred V to several hundred V).

Figure 2:
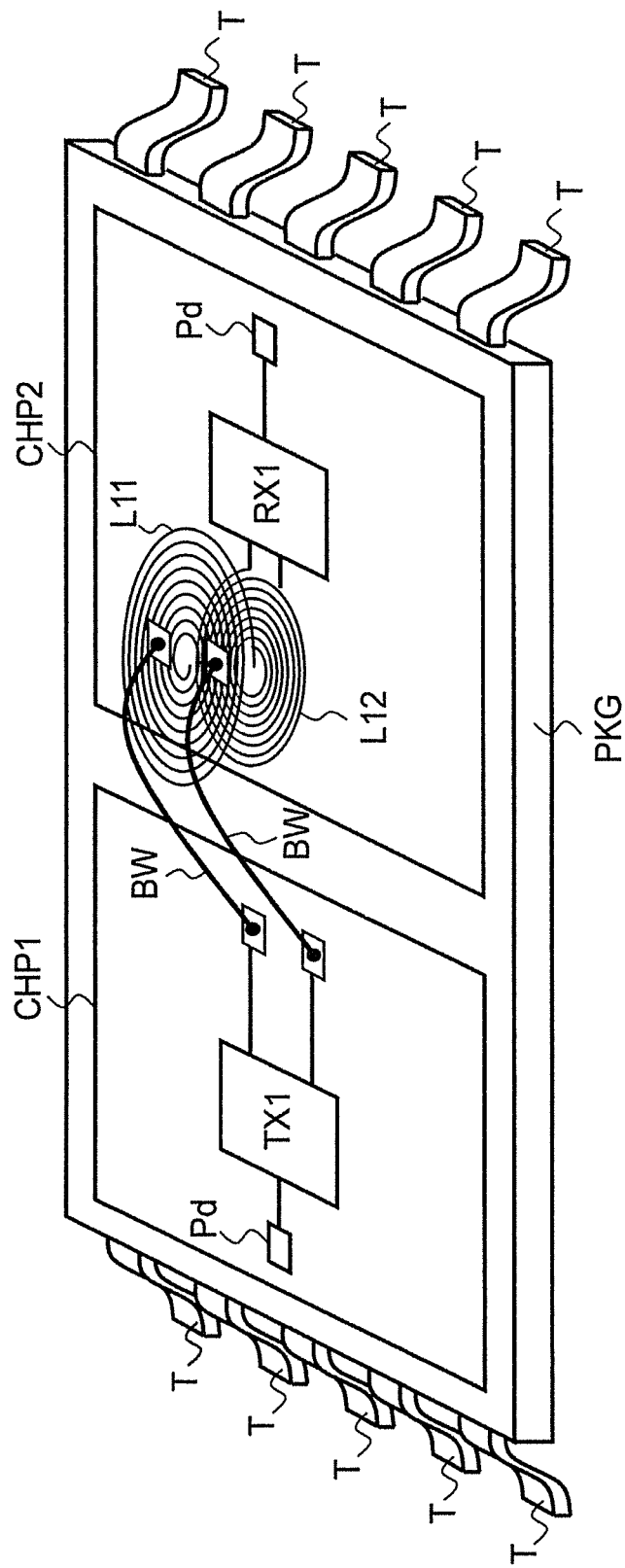
FIG. 2 is a diagram showing a mounting example of the semiconductor apparatus according to the first embodiment.

Here, with reference to FIG. 2, a description will be given of amounting example of the semiconductor apparatus 1. FIG. 2 is a diagram showing the mounting example of the semiconductor apparatus 1. Note that, FIG. 2 is for explaining chiefly the mounting example of the transmitter circuit TX1, the receiver circuit RX1, and the primary coil L11 and the secondary coil L12 provided between the transmitter circuit TX1 and the receiver circuit RX1.

In the mounting example shown in FIG. 2, two semiconductor chips CHP1, CHP2 are mounted on a semiconductor package PKG. The semiconductor chips CHP1, CHP2 each have a pad Pd. Then, the pads Pd of the semiconductor chips CHP1, CHP2 are connected to a plurality of lead terminals (external terminals) T provided at the semiconductor package PKG via not-shown bonding wires.

As shown in FIG. 2, the transmitter circuit TX1 is formed at the semiconductor chip CHP1. At the semiconductor chip CHP2, the receiver circuit RX1, the primary coil L11, and the secondary coil L12 are formed. Further, at the semiconductor chip CHP1, pads connected to the output of the transmitter circuit TX1 are formed. At the semiconductor chip CHP2, pads respectively connected to the opposite ends of the primary coil L11 are formed. Then, the transmitter circuit TX1 is connected to the primary coil L11 formed at the semiconductor chip CHP2 via the pads and bonding wires BW.

Note that, in the example shown in FIG. 2, the primary coil L11 and the secondary coil L12 are respectively formed at a first interconnection layer and a second interconnection layer which are stacked in the top-bottom direction in one semiconductor chip CHP2. Further, the primary coil L11 and the secondary coil L12 may be formed at the semiconductor chip CHP1 with the transmitter circuit TX1. Alternatively, the primary coil L11 and the secondary coil L12 may be formed at a third semiconductor chip formed between the semiconductor chip CHP1 where the transmitter circuit TX1 is formed and the semiconductor chip CHP2 where the receiver circuit RX1 is formed.

Further, the primary coil L11 and the transmitter circuit TX1 may be formed at the semiconductor chip CHP1, and the secondary coil L12 and the receiver circuit RX1 may be formed at the semiconductor chip CHP2. Then, the semiconductor chip CHP1 and the semiconductor chip CHP2 may be bonded to each other.

Alternatively, the transmitter circuit TX1, the receiver circuit RX1, the primary coil L11, and the secondary coil L12 may be formed on one semiconductor chip. In this case, the region where the transmitter circuit TX1 is disposed and the region where the receiver circuit RX1 is disposed are insulated from each other by an insulating layer formed in the semiconductor chip.

Referring back to FIG. 1, a description will be given of an exemplary structure of the semiconductor apparatus 1. The transmitter circuit TX1 operates based on the first power supply belonging to the first power supply system. On the other hand, the receiver circuit RX1 operates based on the second power supply belonging to the second power supply system.

The transmitter circuit TX1 includes a pulse generating circuit PGC, output drivers OD1, OD2, and an output stop circuit 10.

The pulse generating circuit PGC generates a pulse signal P10 in accordance with the edges of an input data signal Din1.

The output driver OD1 outputs an output pulse signal P11 based on the pulse signal P10 to the first end of the primary coil L11. The output pulse signal P11 is a pulse signal for transmitting the rising edge of the input data signal Din1.

The output driver OD2 outputs an output pulse signal P12 based on the pulse signal P10 to the second end of the primary coil L11. The output pulse signal P12 is a pulse signal for transmitting the falling edge of the input data signal Din1.

The output stop circuit 10 stops the output of the output pulse signals P11, P12 for a prescribed period from when the power supply voltage is turned on. In the example of FIG. 1, a stop signal STP output from the output stop circuit 10 is input to the output drivers OD1, OD2. That is, by the stop signal STP output from the output stop circuit 10, the output of the output pulse signals P11, P12 from the output drivers OD1, OD2 is stopped.

The primary coil L11 and the secondary coil L12 convert the output pulse signals P11, P12 output from the transmitter circuit TX1 to a reception signal VR, and transmit the reception signal VR to the receiver circuit RX1. Specifically, by the transition of the output pulse signals P11, P12, the current flowing through the primary coil L11 changes. In accordance therewith, the reception signal VR being the voltage across the opposite ends of the secondary coil L12 changes.

The receiver circuit RX1 reconstructs the input data signal Dint based on the reception signal VR of the secondary coil L12, and outputs the reconstructed signal as an output data signal Dout1.

The transmitter circuit TX1 according to the first embodiment includes the output stop circuit 10 which stops output of the output pulse signal P11 and the output pulse signal P12 for a prescribed period from when the power supply voltage VDD1 is turned on. Therefore, it becomes possible to suppress output of erroneous pulses which are associated with turn-on of the power supply voltage VDD1. An increase in the power supply voltage VDD1 at the electrostatic discharge damage test is a physical phenomenon which is similar to turn-on of the power supply voltage VDD1. Accordingly, with the transmitter circuit TX1 according to the first embodiment, at the electrostatic discharge damage test also, the output stop circuit 10 activates and any failure attributed to erroneous pulses associated with an increase in the power supply voltage VDD1 can be suppressed.

<Specific Circuit Structure of Transmitter Circuit TX1>

Figure 3:
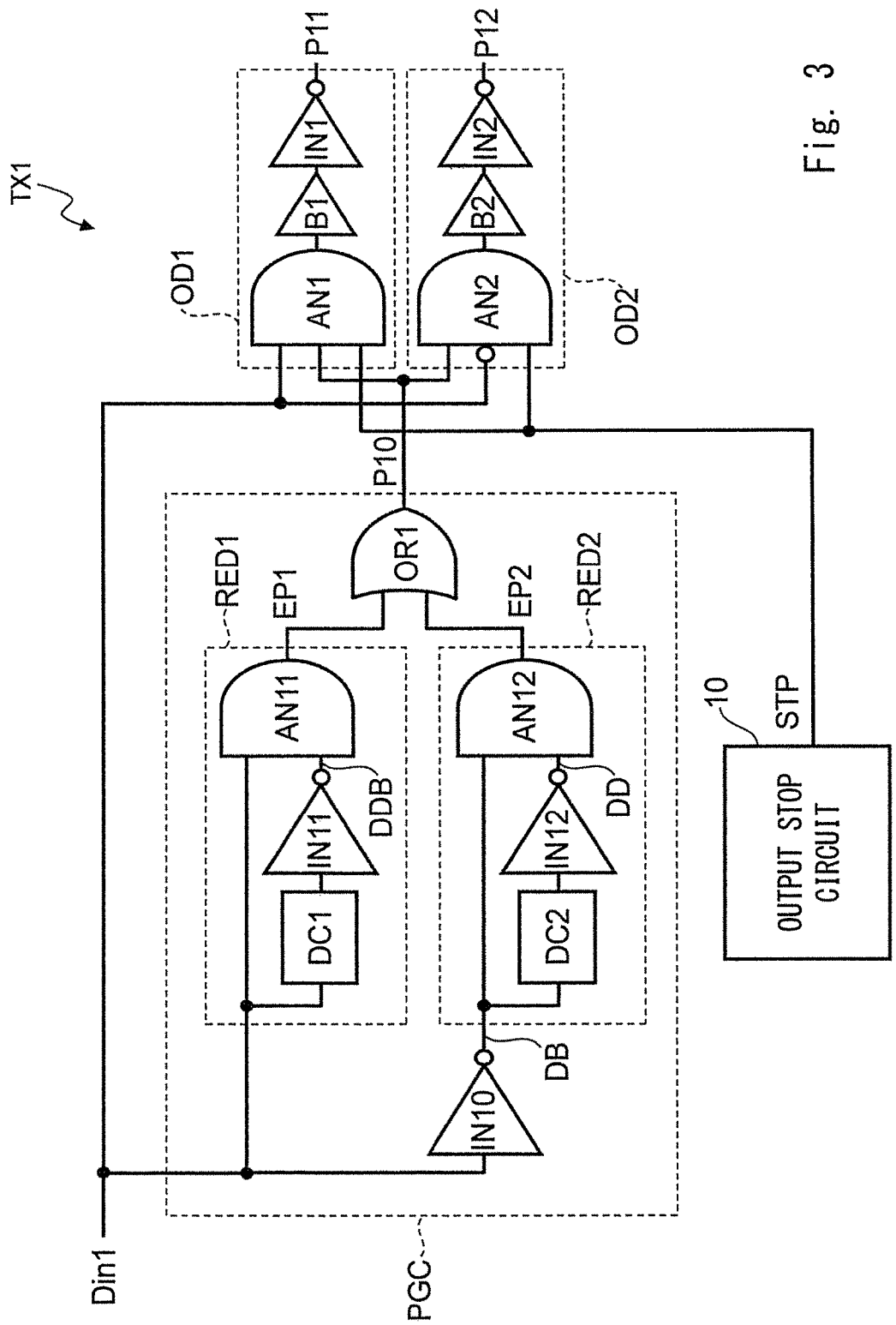
FIG. 3 is a circuit diagram showing an example of a specific circuit structure of a transmitter circuit TX1 according to the first embodiment.

Next, with reference to FIG. 3, a description will be given of a specific circuit structure of the transmitter circuit TX1. The circuit structure shown below is merely an example. FIG. 3 is a circuit diagram showing an example of the specific circuit structure of the transmitter circuit TX1 according to the first embodiment. As shown in FIGS. 1 and 3, the transmitter circuit TX1 includes the pulse generating circuit PGC, the output drivers OD1, OD2, and the output stop circuit 10.

As shown in FIG. 3, the pulse generating circuit PGC includes one inverter IN10, two rising edge detecting circuits RED1, RED2, and one OR gate OR1. Here, the rising edge detecting circuits RED1, RED2 are similar to each other in the circuit structure. The rising edge detecting circuit RED1 includes a delay circuit DC1, an inverter IN11, and an AND gate AN11. The rising edge detecting circuit RED2 includes a delay circuit DC2, an inverter IN12, and an AND gate AN12.

As shown in FIG. 3, the output drivers OD1, OD2 are substantially similar to each other in the circuit structure. The output driver OD1 includes an AND gate AN1, a buffer circuit B1, and an inverter IN1. The output driver OD2 includes an AND gate AN2, a buffer circuit B2, and an inverter IN2.

Note that, as shown in FIG. 3, the difference between the output drivers OD1, OD2 lies in that, while the input data signal Din1 is input to the output driver OD1, an inverted signal of the input data signal Dint is input to the output driver OD2. That is, the AND gate AN2 includes an inverter at the input terminal for the input data signal Din1.

In the following, the connection relationship will be described.

To the rising edge detecting circuit RED1, the input data signal Din1 is input. The rising edge detecting circuit RED1 outputs an edge pulse signal EP1 at the rising edge of the input data signal Dint. Specifically, the input data signal Din1 is delayed by the delay circuit DC1, and inverted by the inverter IN11 An inverted delayed data signal DDB output from the inverter IN11 is input to the AND gate AN11 together with the input data signal Din1. Then, the AND gate AN11 outputs the edge pulse signal EP1.

On the other hand, to the rising edge detecting circuit RED2, an inverted signal of the input data signal Din1 via the inverter IN10 (hereinafter referred to as the inverted data signal DB) is input. The rising edge detecting circuit RED2 outputs an edge pulse signal EP2 at the rising edge of the inverted data signal DB, that is, at the falling edge of the input data signal Din1. Specifically, the inverted data signal DB is delayed by the delay circuit DC2, and inverted by the inverter IN12, to be a normal delayed data signal DD. The normal delayed data signal DD output from the inverter IN12 is input to the AND gate AN12 together with the inverted data signal DB. Then, the AND gate AN12 outputs the edge pulse signal EP2.

The edge pulse signals EP1, EP2 output from two rising edge detecting circuits RED1, RED2 are both input to the OR gate OR1. The OR gate OR1 outputs a pulse signal P10 transmitting the rising edge and the falling edge of the input data signal Din1 as the output signal of the pulse generating circuit PGC.

The pulse signal P10 is input to the AND gates AN1, AN2 respectively structuring the output drivers OD1, OD2. Further, to the AND gate AN1, the input data signal Din1 is input. On the other hand, to the AND gate AN2, an inverted signal of the input data signal Din1 is input.

As a result, the AND gate AN1 outputs an H (High)-active pulse signal for transmitting the rising edge of the input data signal Din1. This pulse signal is input to the inverter IN1 via the buffer circuit B1. Then, the inverter IN1 outputs an L (Low)-active output pulse signal P11 for transmitting the rising edge of the input data signal Din1 as the output signal of the output driver OD1.

On the other hand, the AND gate AN2 outputs an H-active pulse signal for transmitting the falling edge of the input data signal Din1. This pulse signal is input to the inverter IN2 via the buffer circuit B2. Then, the inverter IN2 outputs an L-active output pulse signal P12 for transmitting the falling edge of the input data signal Din1 as the output signal of the output driver OD2.

Here, to the AND gates AN1, AN2 respectively structuring the output drivers OD1, OD2, the stop signal STP output from the output stop circuit 10 is input. During the period where the stop signal STP is L level, the output of the output pulse signals P11, P12 respectively output from the output drivers OD1, OD2 always attain H level. That is, during the period where the stop signal STP is L level, despite the output of the pulse signal P10 from the pulse generating circuit PGC, the output pulse signals P11, P12 are not output from the output drivers OD1, OD2.

Note that, the pulse generating circuit PGC may not include the OR gate OR1. In this case, the edge pulse signals EP1, EP2 are respectively directly input to the AND gates AN1, AN2. To the AND gate AN1, just the edge pulse signal EP1 and the stop signal STP should be input, and the input data signal Din1 is not required to be input. Further, to the AND gate AN2, just the edge pulse signal EP2 and the stop signal STP should be input, and the inverted signal of the input data signal Dint is not required to be input.

<Operation of Transmitter Circuit TX1>

Figure 4:
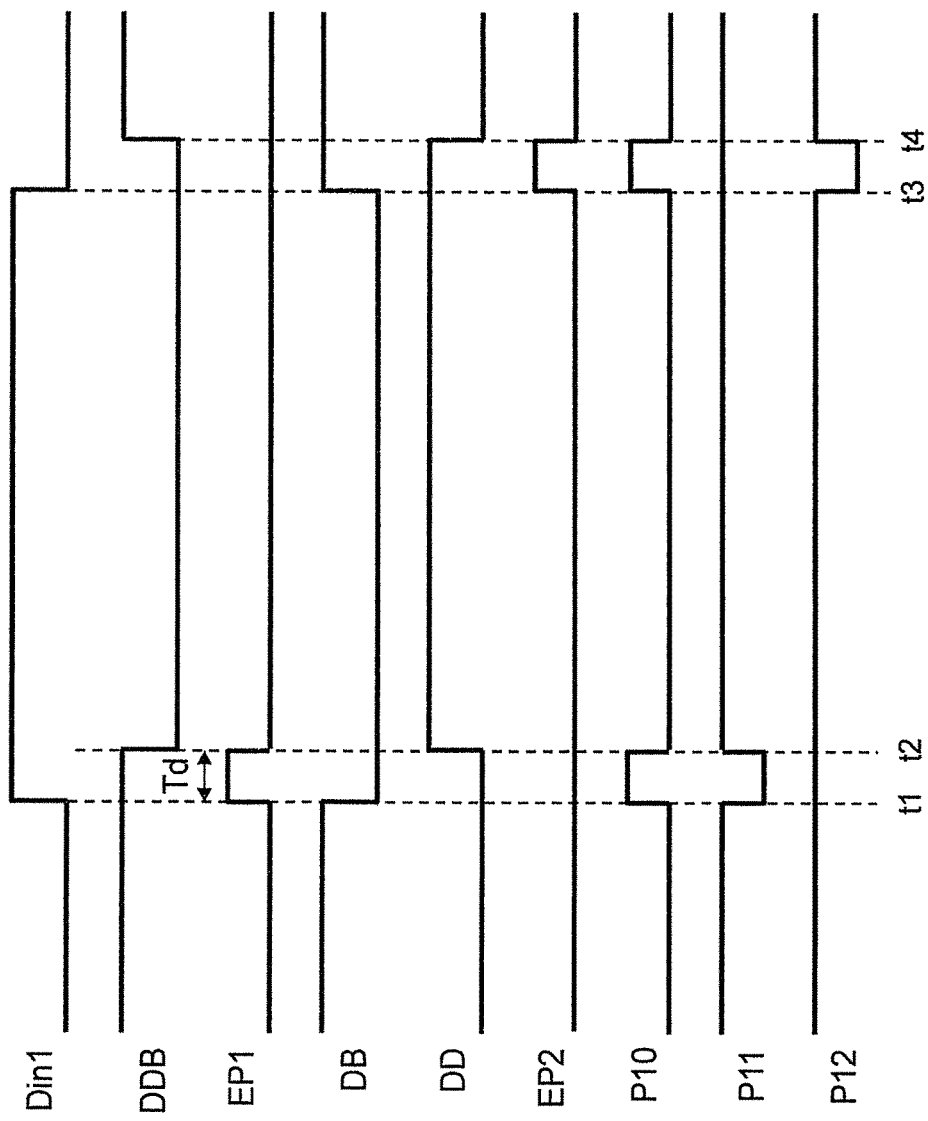
FIG. 4 is a timing chart showing one example of an operation of the transmitter circuit TX1 according to the first embodiment.

Next, with reference to FIG. 4, a description will be given of the normal operation of the transmitter circuit TX1. FIG. 4 is a timing chart showing one example of the normal operation of the transmitter circuit TX1 according to the first embodiment. Note that, in the normal operation mode shown in FIG. 4, the output stop circuit 10 does not actuate.

FIG. 4 shows, in order from the top, the input data signal Din1, the inverted delayed data signal DDB, the edge pulse signal EP1, the inverted data signal DB, the normal delayed data signal DD, the edge pulse signal EP2, the pulse signal P10, the output pulse signal P11, and the output pulse signal P12.

The inverted delayed data signal DDB shown at the second level is a signal obtained by inverting the input data signal Din1 shown at the top level and delaying by a delay time Td.

The edge pulse signal EP1 shown at the third level is a pulse signal having a width Td and indicative of the rising edge of the input data signal Din1 shown at the top level. The edge pulse signal EP1 is obtained by AND logic of the input data signal Din1 shown at the top level and the inverted delayed data signal DDB shown at the second level.

The inverted data signal DB shown at the fourth level is an inverted signal of the input data signal Din1 shown at the top level.

The normal delayed data signal DD shown at the fifth level is a signal obtained by delaying the input data signal Din1 shown at the top level by a delay time Td.

The edge pulse signal EP2 shown at the sixth level is a pulse signal having the width Td and indicative of the falling edge of the input data signal Din1 shown at the top level. The edge pulse signal EP2 is obtained by AND logic of the inverted data signal DB shown at the fourth level and the normal delayed data signal DD shown at the fifth level.

The pulse signal P10 shown at the seventh level is a pulse signal indicative of the rising edge and the falling edge of the input data signal Din1 shown at the top level. The pulse signal P10 is obtained by OR logic of the edge pulse signal EP1 shown at the third level and the edge pulse signal EP2 shown at the sixth level.

The output pulse signal P11 shown at the eighth level is an L-active pulse signal indicative of the rising edge of the input data signal Din1 shown at the top level. The output pulse signal P11 is a signal obtained by inverting a signal obtained by AND logic of the input data signal Din1 shown at the top level and the pulse signal P10 shown at the seventh level.

The output pulse signal P12 shown at the bottom level is an L-active pulse signal indicative of the falling edge of the input data signal Din1 shown at the top level. The output pulse signal P12 is a signal obtained by inverting a signal obtained by AND logic of the inverted data signal DB shown at the fourth level and the pulse signal P10 shown at the seventh level.

Next, a description will be given in time sequence.

At time point t1, the input data signal Din1 shown at the top level switches from L level to H level (i.e., the rising edge). Therefore, the edge pulse signal EP1 shown at the third level and the pulse signal P10 shown at the seventh level switch from L level to H level, and the output pulse signal P11 shown at the eighth level switches from H level to L level.

At time point t2, the inverted delayed data signal DDB shown at the second level switches from H level to L level. Therefore, the edge pulse signal EP1 shown at the third level and the pulse signal P10 shown at the seventh level switch from H level to L level, and the output pulse signal P11 shown at the eighth level switches from L level to H level.

At time point t3, the input data signal Din1 shown at the top level switches from H level to L level (i.e., the falling edge), and the inverted data signal DB shown at the fourth level switches from L level to H level. Therefore, the edge pulse signal EP2 shown at the sixth level and the pulse signal P10 shown at the seventh level switch from L level to H level, and the output pulse signal P12 shown at the bottom level switches from H level to L level.

At time point t4, the normal delayed data signal DD shown at the fifth level switches from H level to L level. Therefore, the edge pulse signal EP2 shown at the sixth level and pulse signal P10 shown at the seventh level switch from H level to L level, and the output pulse signal P12 shown at the bottom level switches from L level to H level.

<Specific Circuit Structure of Receiver Circuit RX1>

Figure 5:
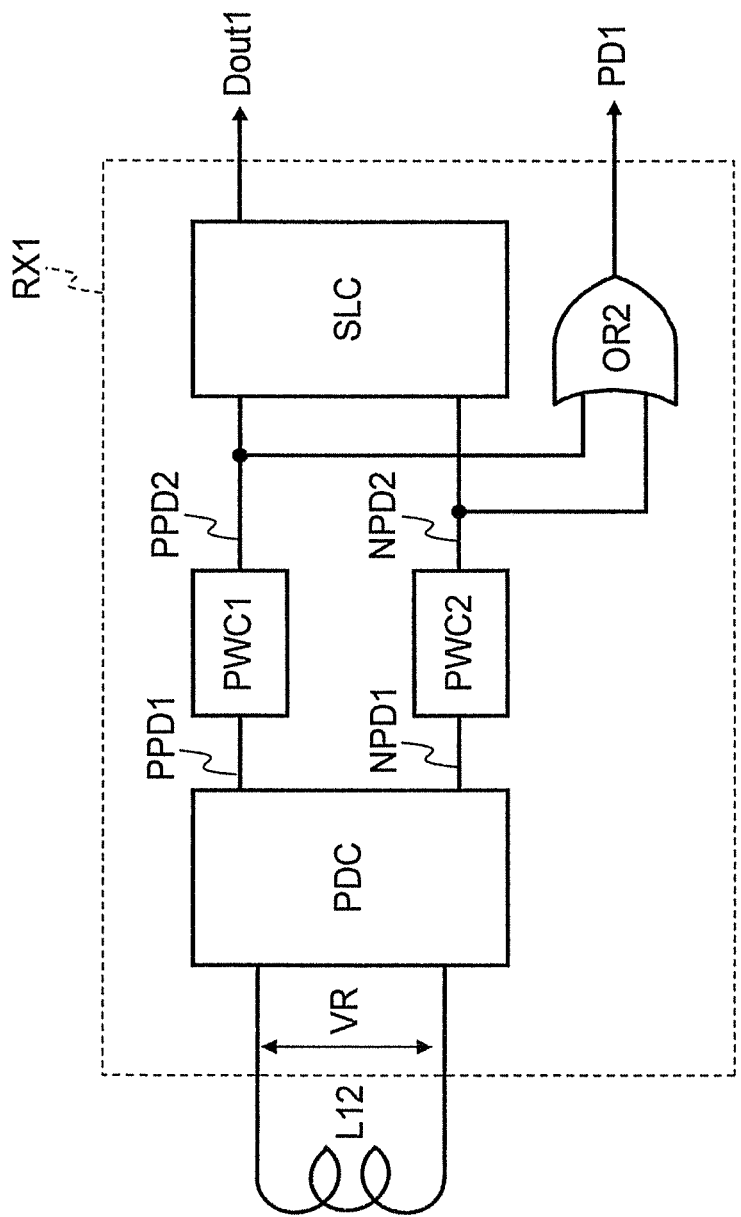
FIG. 5 is a circuit diagram showing an example of a specific circuit structure of a receiver circuit RX1 according to the first embodiment.

Next, with reference to FIG. 5, a description will be given of a specific circuit structure of the receiver circuit RX1. The circuit structure shown below is merely an example. FIG. 5 is a circuit diagram showing an example of the specific circuit structure of the receiver circuit RX1 according to the first embodiment. As shown in FIG. 5, the receiver circuit RX1 includes a pulse detecting circuit PDC, two pulse widening circuits PWC1, PWC2, a sequential logic circuit SLC, and an OR gate OR2.

In the following, the connection relationship will be described.

The reception signal VR generated across the opposite ends of the secondary coil L12 in response to the output pulse signals P11, P12 output from the transmitter circuit TX1 is input to the pulse detecting circuit PDC. The pulse detecting circuit PDC outputs a positive pulse detection signal PPD1 upon detection of a positive pulse, and outputs a negative pulse detection signal NPD1 upon detection of a negative pulse. Specifically, when the output pulse signals P11, P12 are output from the transmitter circuit TX1, whichever signal is output, a pair of positive pulse detection signal PPD1 and negative pulse detection signal NPD1 is output. However, between the output pulse signal P11 and the output pulse signal P12, the output order of the positive pulse detection signal PPD1 and the negative pulse detection signal NPD1 is reversed. In the present embodiment, when the output pulse signal P11 is output, the positive pulse detection signal PPD1 is firstly output; and when the output pulse signal P12 is output, the negative pulse detection signal NPD1 is firstly output.

The positive pulse detection signal PPD1 is input to the pulse widening circuit PWC1, and the negative pulse detection signal NPD1 is input to the pulse widening circuit PWC2. The pulse widening circuits PWC1, PWC2 respectively widen the received positive pulse detection signal PPD1 and negative pulse detection signal NPD1, and output a positive pulse detection signal PPD2 and a negative pulse detection signal NPD2. Here, the pulse widening circuits PWC1, PWC2 delay only the falling edge of each of the positive pulse detection signal PPD1 and the negative pulse detection signal NPD1, without changing the rising edge. Thus, the H level period of the positive pulse detection signal PPD2 and the H level period of the negative pulse detection signal NPD2 partially overlap with each other.

The positive pulse detection signal PPD2 and the negative pulse detection signal NPD2 are input to the sequential logic circuit SLC. The sequential logic circuit SLC recognizes the order of the received positive pulse detection signal PPD2 and negative pulse detection signal NPD2, and outputs the output data signal Dout1. Specifically, when the positive pulse detection signal PPD2 is firstly received, the sequential logic circuit SLC outputs H level as the output data signal Dout1. On the other hand, when the negative pulse detection signal NPD2 is firstly received, the sequential logic circuit SLC outputs L level as the output data signal Dout1.

Further, the positive pulse detection signal PPD2 and the negative pulse detection signal NPD2 are input to the OR gate OR2. The OR gate OR2 outputs a pulse detection signal PD1. As will be described later in a third embodiment, the pulse detection signal PD1 can be used, for example, as a reset signal of a timer for measuring the time period from when the pulse detection signal PD1 is output. Note that, as can be seen from FIG. 5, the OR gate OR2 is not essential in generating the output data signal Dout1.

<Operation of Receiver Circuit RX1>

Figure 6:
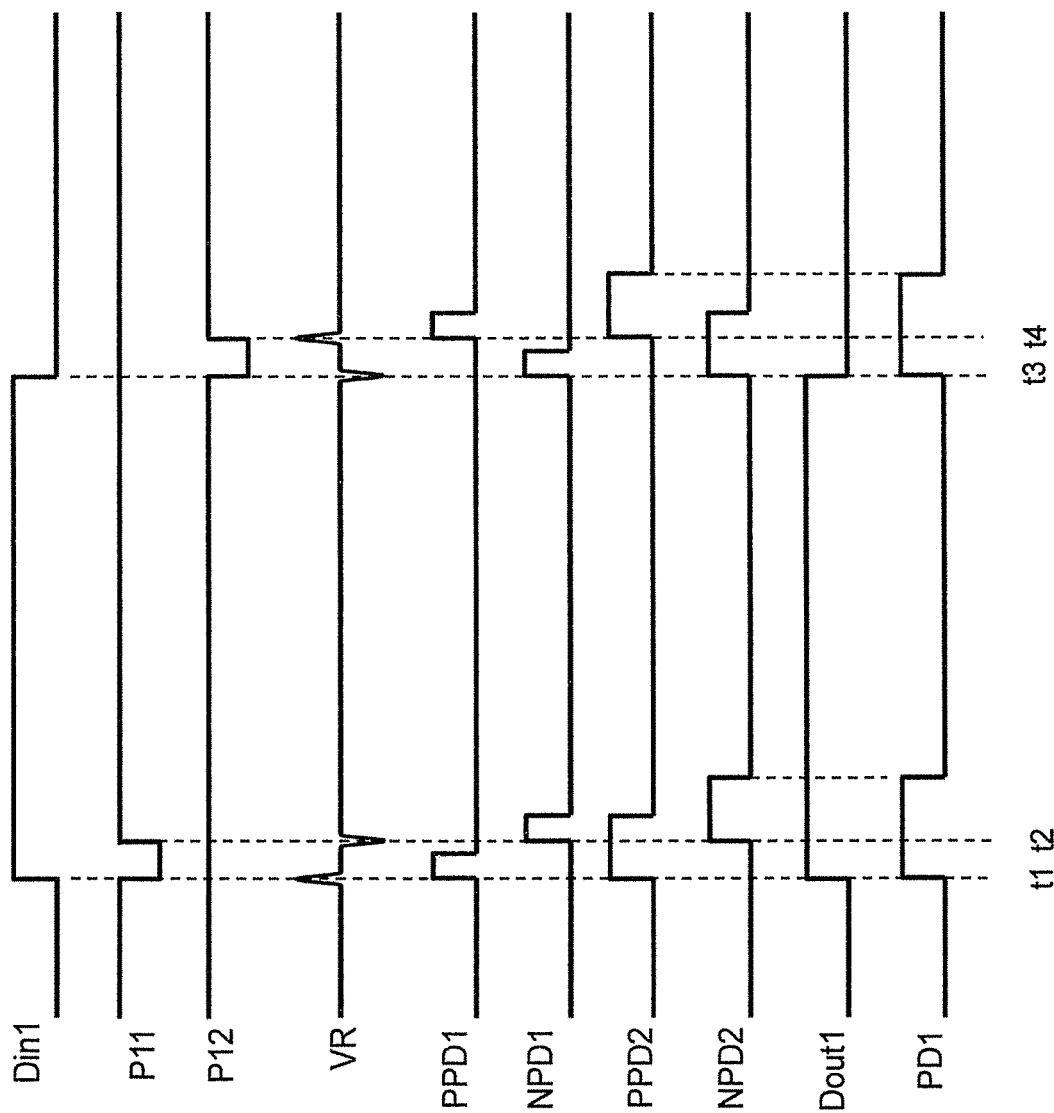
FIG. 6 is a timing chart showing one example of an operation of the receiver circuit RX1 according to the first embodiment.

Next, with reference to FIG. 6, a description will be given of the operation of the receiver circuit RX1. FIG. 6 is a timing chart showing one example of the operation of the receiver circuit RX1 according to the first embodiment. FIG. 6 shows, in order from the top, the input data signal Din1 of the transmitter circuit TX1, the output pulse signals P11, P12 output from the transmitter circuit TX1, the reception signal VR of the secondary coil L12, the positive pulse detection signal PPD1, the negative pulse detection signal NPD1, the positive pulse detection signal PPD2, the negative pulse detection signal NPD2, the output data signal Dout1, and the pulse detection signal PD1.

In the reception signal VR of the secondary coil L12 shown at the fourth level, in accordance with the output pulse signal P11 shown at the second level and the output pulse signal P12 shown at the third level, positive pulses projecting upward in the graph or negative pulses projecting downward in the graph are generated. Specifically, at the falling edge of the output pulse signal P11 and the rising edge of the output pulse signal P12, positive pulses are generated. On the other hand, at the rising edge of the output pulse signal P11 and the falling edge of the output pulse signal P12, negative pulses are generated.

The positive pulse detection signal PPD1 shown at the fifth level is output at the timing where the positive pulse in the reception signal VR is generated.

The negative pulse detection signal NPD1 shown at the sixth level is output at the timing where the negative pulse in the reception signal VR is generated.

The positive pulse detection signal PPD2 shown at the seventh level is a signal widened by delaying the falling edge of the positive pulse detection signal PPD1 at the pulse widening circuit PWC1.

The negative pulse detection signal NPD2 shown at the eighth level is a signal widened by delaying the falling edge of the negative pulse detection signal NPD1 at the pulse widening circuit PWC2.

The pulse detection signal PD1 shown at the bottom level is a signal which is output every time one of the output pulse signal P11 and the output pulse signal P12 is output. As described above, the pulse detection signal PD1 is generated from the positive pulse detection signal PPD2 and the negative pulse detection signal NPD2.

Next, a description will be given in time sequence. At time point t1, since the output pulse signal P11 switches from H level to L level, a positive pulse is generated in the reception signal VR. Therefore, at time point t1, the positive pulse detection signals PPD1, PPD2 switch from L level to H level. As a result of the positive pulse detection signal PPD2 switching from L level to H level, H level is output as the output data signal Dout1.

At time point t2, since the output pulse signal P11 switches from L level to H level, a negative pulse is generated in the reception signal VR. Therefore, at time point t2, the negative pulse detection signals NPD1, NPD2 switch from L level to H level. That is, at time point t2, while the negative pulse detection signal NPD2 switches from L level to H level, the positive pulse detection signal PPD2 remains at H level. Therefore, L level is not output as the output data signal Dout1, and H level is maintained. That is, when the negative pulse detection signal NPD2 transits from L level to H level while the positive pulse detection signal PPD2 is H level, the output data signal Dout1 does not change.

At time point t3, since the output pulse signal P12 switches from H level to L level, a negative pulse is generated in the reception signal VR. Therefore, at time point t3, the negative pulse detection signals NPD1, NPD2 switch from L level to H level. As a result of the negative pulse detection signal NPD2 switching from L level to H level, L level is output as the output data signal Dout1.

At time point t4, since the output pulse signal P12 switches from L level to H level, a positive pulse is generated in the reception signal VR. Therefore, at time point t4, the positive pulse detection signals PPD1, PPD2 switch from L level to H level. That is, at time point t4, while the positive pulse detection signal PPD2 switches from L level to H level, the negative pulse detection signal NPD2 remains at H level. Therefore, H level is not output as the output data signal Dout1, and L level is maintained. That is, when the positive pulse detection signal PPD2 transits from L level to H level while the negative pulse detection signal NPD2 is H level, the output data signal Dout1 does not change.

<Circuit Structure of Transmitter Circuit TX10 according to Comparative Example>

Figure 7:
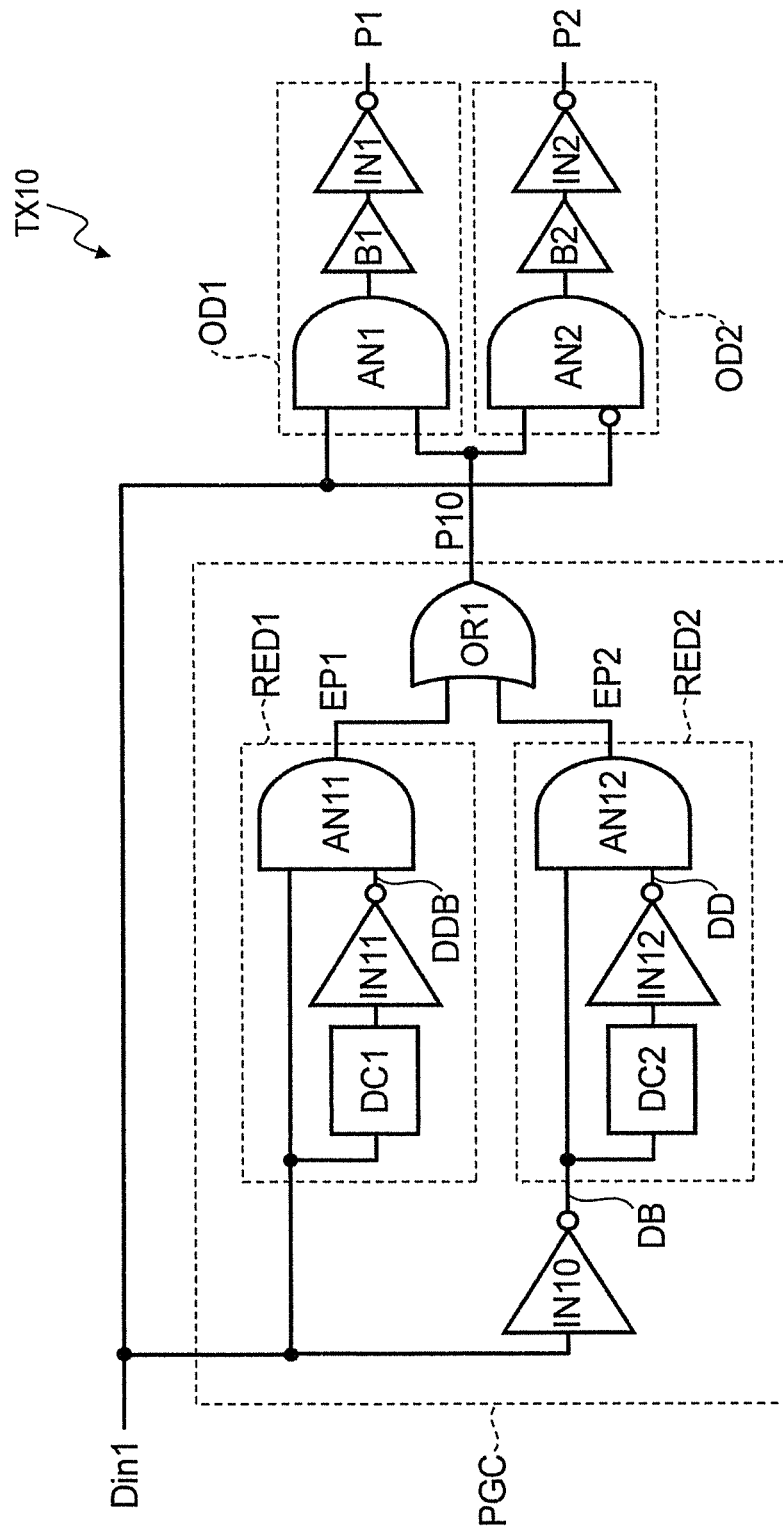
FIG. 7 is a circuit diagram showing one example of a specific circuit structure of the transmitter circuit TX10 according to Comparative Example of the first embodiment.

Next, with reference to FIG. 7, a description will be given of a transmitter circuit TX10 according to Comparative Example of the first embodiment. FIG. 7 is a circuit diagram showing one example of a specific circuit structure of the transmitter circuit TX10 according to Comparative Example of the first embodiment. As shown in FIG. 7, the transmitter circuit TX10 is different from the transmitter circuit TX1 according to the first embodiment shown in FIG. 3 in including no output stop circuit 10. Other structure is similar to that of the transmitter circuit TX1 according to the first embodiment shown in FIG. 3.

<Mechanism of Failure Occurrence in Transmitter Circuit TX10 According to Comparative Example>

Figure 8:
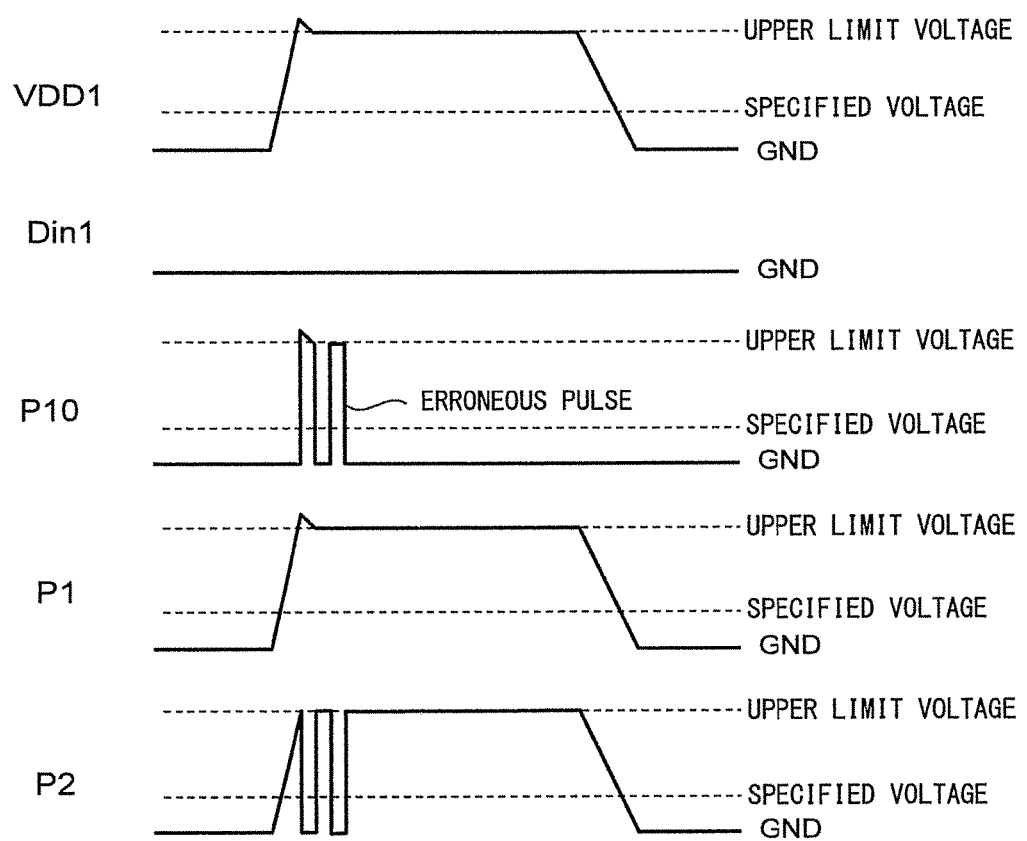
FIG. 8 is a timing chart for describing a mechanism of failure occurrence at an HBM test with the transmitter circuit TX10 according to Comparative Example.

Next, with reference to FIG. 8, a description will be given of the mechanism of failure occurrence at the HBM test with the transmitter circuit TX10 according to Comparative Example. FIG. 8 is a timing chart for describing the mechanism of failure occurrence at the HBM test with the transmitter circuit TX10 according to Comparative Example. FIG. 8 shows, in order from the top, the power supply voltage VDD1, the input data signal Din1, the pulse signal P10, the output pulse signal P1, and the output pulse signal P2.

As shown at the top level, by application of surge current, the power supply voltage VDD1 continuously increases exceeding the specified voltage. In the example shown in FIG. 8, a limiter (not shown) is provided such that the power supply voltage VDD1 does not exceed the upper limit voltage. Therefore, after the application of surge current, for a while, the power supply voltage VDD1 becomes constant at the upper limit voltage.

As shown at the second level, the input data signal Din1 remains at L level.

As shown at the third level, in accordance with the increase in the power supply voltage VDD1, an erroneous pulse may be generated in the pulse signal P10 output from the pulse generating circuit PGC. In the example of FIG. 8, two erroneous pulses are generated. Similarly to the turn-on mode of the power supply voltage VDD1, the unstable state of the output signals of the delay circuits DC1, DC2 and the signal level of the internal nodes in the pulse generating circuit PGC causes such erroneous pulses. Note that, the erroneous pulses shown in FIG. 8 is merely an example, and a single erroneous pulse may cause failure.

As a result, erroneous pulses are generated in the output pulse signal P2 shown at the fifth level. On the other hand, no erroneous pulses are generated in the output pulse signal P1 shown at the fourth level. That is, a potential difference occurs between the output pulse signals P1, P2, and large current flows through the primary coil L11. As a result, failure such as a breakdown of the output drivers OD1, OD2 or a break of the primary coil L11 may occur.

<Mechanism of Failure Suppression in Transmitter Circuit TX1>

Figure 9:
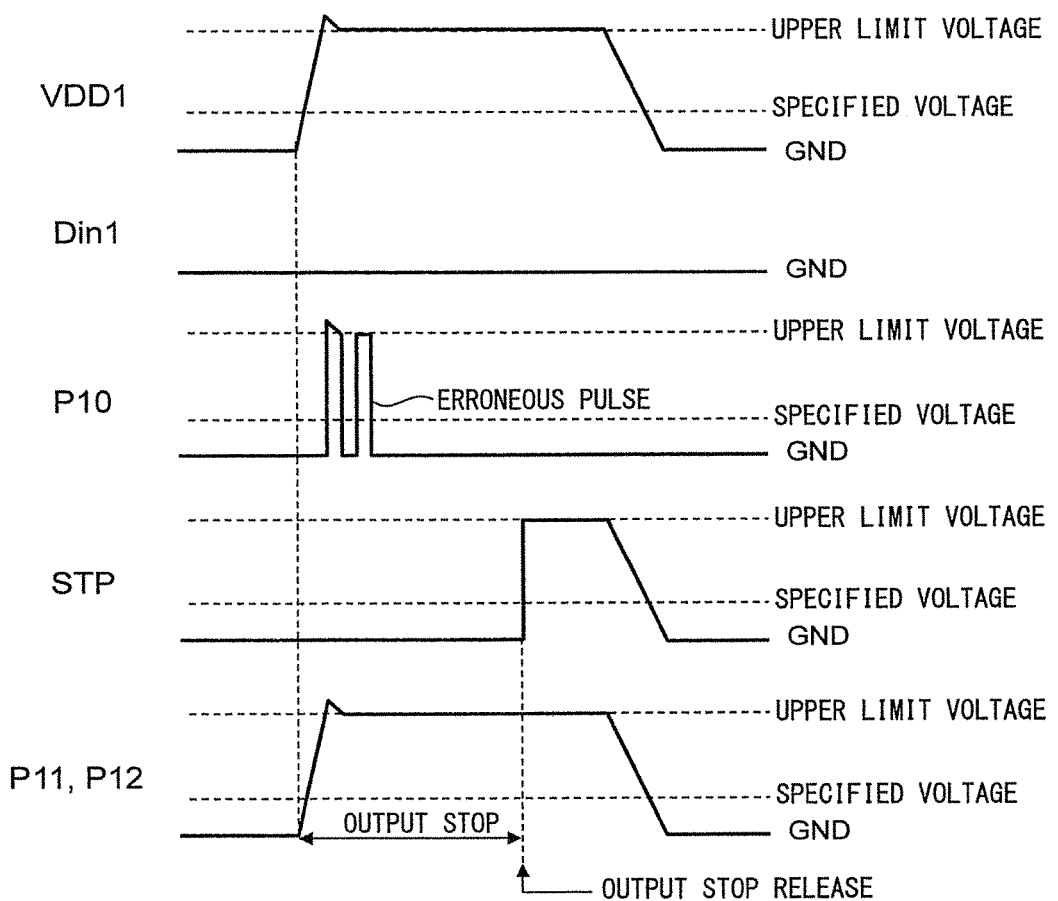
FIG. 9 is a timing chart for describing the mechanism of suppressing failure at the HBM test with the transmitter circuit TX1.

Next, with reference to FIG. 9, a description will be given of the mechanism of suppressing failure at the HBM test with the transmitter circuit TX1 according to the present embodiment shown in FIG. 3. FIG. 9 is a timing chart for describing the mechanism of suppressing failure at the HBM test with the transmitter circuit TX1.

FIG. 9 shows, in order from the top, the power supply voltage VDD1, the input data signal Din1, the pulse signal P10, the stop signal STP, and the output pulse signals P11, P12. The power supply voltage VDD1 shown at the top level, the input data signal Dint shown at the second level, and the pulse signal P10 shown at the third level are identical to those in FIG. 8.

As shown in FIG. 3, the transmitter circuit TX1 according to the present embodiment includes the output stop circuit 10 which stops output of the output pulse signals P11, P12 for a prescribed period from when the power supply voltage VDD1 is turned on. The stop signal STP output from the output stop circuit 10 is input to the AND gates AN1, AN2 of the output drivers OD1, OD2. Therefore, during the period where the stop signal STP is L level, both the output pulse signals P11, P12 are maintained at H level. In other words, during the period where the stop signal STP is L level, the output of the output pulse signals P11, P12 is stopped.

As shown at the fourth level in FIG. 9, similarly to the turn-on mode of the power supply voltage VDD1, the stop signal STP becomes L level for a prescribed period from when the power supply voltage VDD1 starts to increase by the HBM test.

Accordingly, as shown at the fifth level, the output pulse signals P11, P12 become identical to each other in waveform, and no erroneous pulses are generated in both of the output pulse signals P11, P12. That is, the output pulse signals P11, P12 attain the identical potential, and no current flows through the primary coil L11. As a result, failure such as a breakdown of the output drivers OD1, OD2 or a break of the primary coil L11 can be suppressed.

As has been described above, the transmitter circuit TX1 according to the first embodiment includes the output stop circuit 10 which stops output of the output pulse signal P11 and the output pulse signal P12 for a prescribed period from when the power supply voltage VDD1 is turned on. Therefore, erroneous pulses associated with turn-on of the power supply voltage VDD1 can be suppressed from being output.

An increase in the power supply voltage VDD1 at the electrostatic discharge damage test is a physical phenomenon which is similar to turn-on of the power supply voltage VDD1. Accordingly, with the transmitter circuit TX1 according to the first embodiment, at the electrostatic discharge damage test also, the output stop circuit 10 activates and any failure attributed to erroneous pulses associated with an increase in the power supply voltage VDD1 can be suppressed.

<Specific Circuit Structure of Output Stop Circuit 10>

Figure 10:
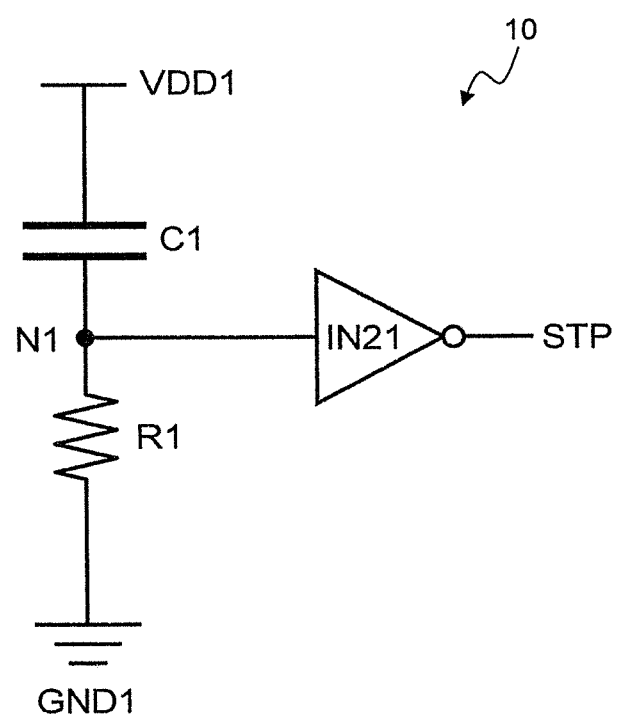
FIG. 10 is a circuit diagram showing one example of the specific circuit structure of the output stop circuit 10 according to the first embodiment.

Next, with reference to FIG. 10, a description will be given of a specific circuit structure of the output stop circuit 10 according to the first embodiment. The circuit structure shown below is merely an example. FIG. 10 is a circuit diagram showing one example of the specific circuit structure of the output stop circuit 10 according to the first embodiment. As shown in FIG. 10, the output stop circuit 10 includes a resistor element R1, a capacitor element C1, and an inverter IN21.

An input N1 of the inverter IN21 is connected to the power supply via the capacitor element C1. Further, the input N1 of the inverter IN21 is grounded (connected to the ground) via the resistor element R1. That is, the input N1 of the inverter IN21 is a connection node between the capacitor element C1 and the resistor element R1. Then, the stop signal STP is output from the inverter IN21.

Note that, the stop signal STP can also be generated by grounding the capacitor element C1 and connecting the resistor element R1 to the power supply. In this case, another inverter should be added to the output of the inverter IN21.

<Operation of Output Stop Circuit 10>

Figure 11:
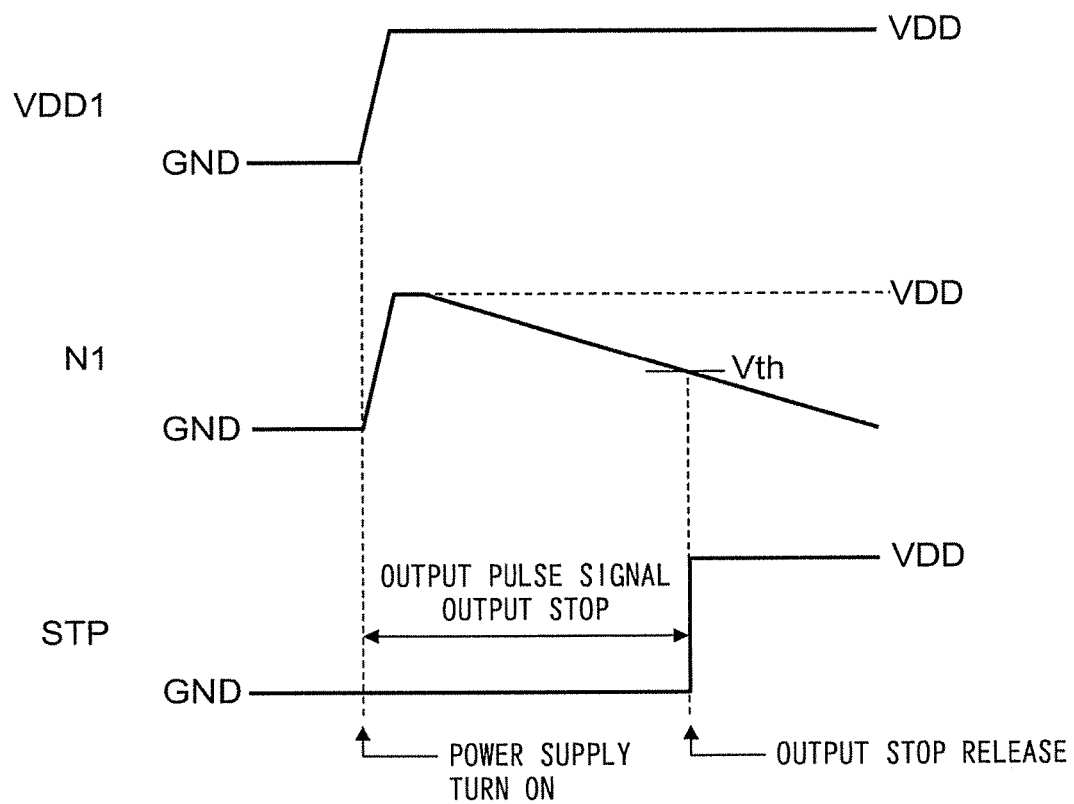
FIG. 11 is a timing chart for describing an operation of the output stop circuit 10 according to the first embodiment when the power supply voltage is turned on, FIG. 12 is a circuit diagram showing Variation of the transmitter circuit TX1 according to the first embodiment.

Next, with reference to FIG. 11, a description will be given of the operation of the output stop circuit 10 according to the first embodiment when the power supply voltage is turned on. FIG. 11 is a timing chart for describing the operation of the output stop circuit 10 according to the first embodiment when the power supply voltage is turned on. FIG. 11 shows, in order from the top, the power supply voltage VDD1, the voltage of the input N1 of the inverter IN21, and the stop signal STP.

As shown at the top level, when the power supply voltage VDD1 increases from a ground voltage GND to a specified voltage VDD by being turned on, as shown at the second level, the voltage of the input N1 of the inverter IN21 connected to the power supply via the capacitor element C1 also increases following the specified voltage VDD. Accordingly, as shown at the third level, the stop signal STP being the output of the inverter IN21 becomes L level upon turn-on of the power supply voltage VDD1.

As shown at the second level, the voltage of the input N1 of the inverter IN21 gradually reduces by being discharged via the resistor element R1. When the voltage of the input N1 of the inverter IN21 reaches a logic threshold voltage Vth of the inverter IN21, the output of the inverter IN21 transits from L level to H level. In accordance therewith, as shown at the third level, the stop signal STP transits from L level to H level. During a period where the stop signal STP is L level, the output of the output pulse signals P11, P12 is stopped.

The stop period is determined by the time constant of the resistor element R1 and the capacitor element C1.

<Variations of Transmitter Circuit TX1>

Figure 12:
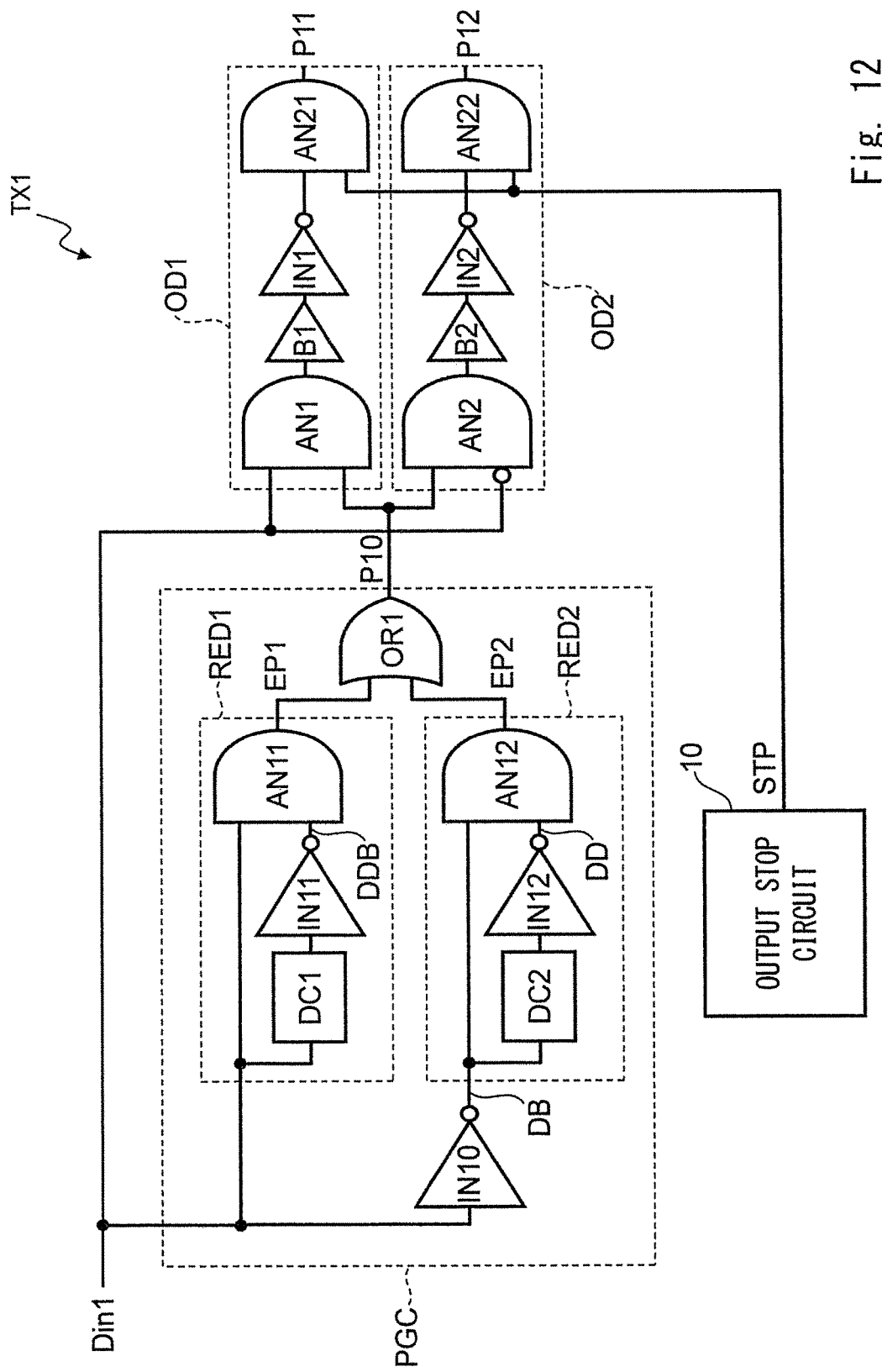
Figure 13:
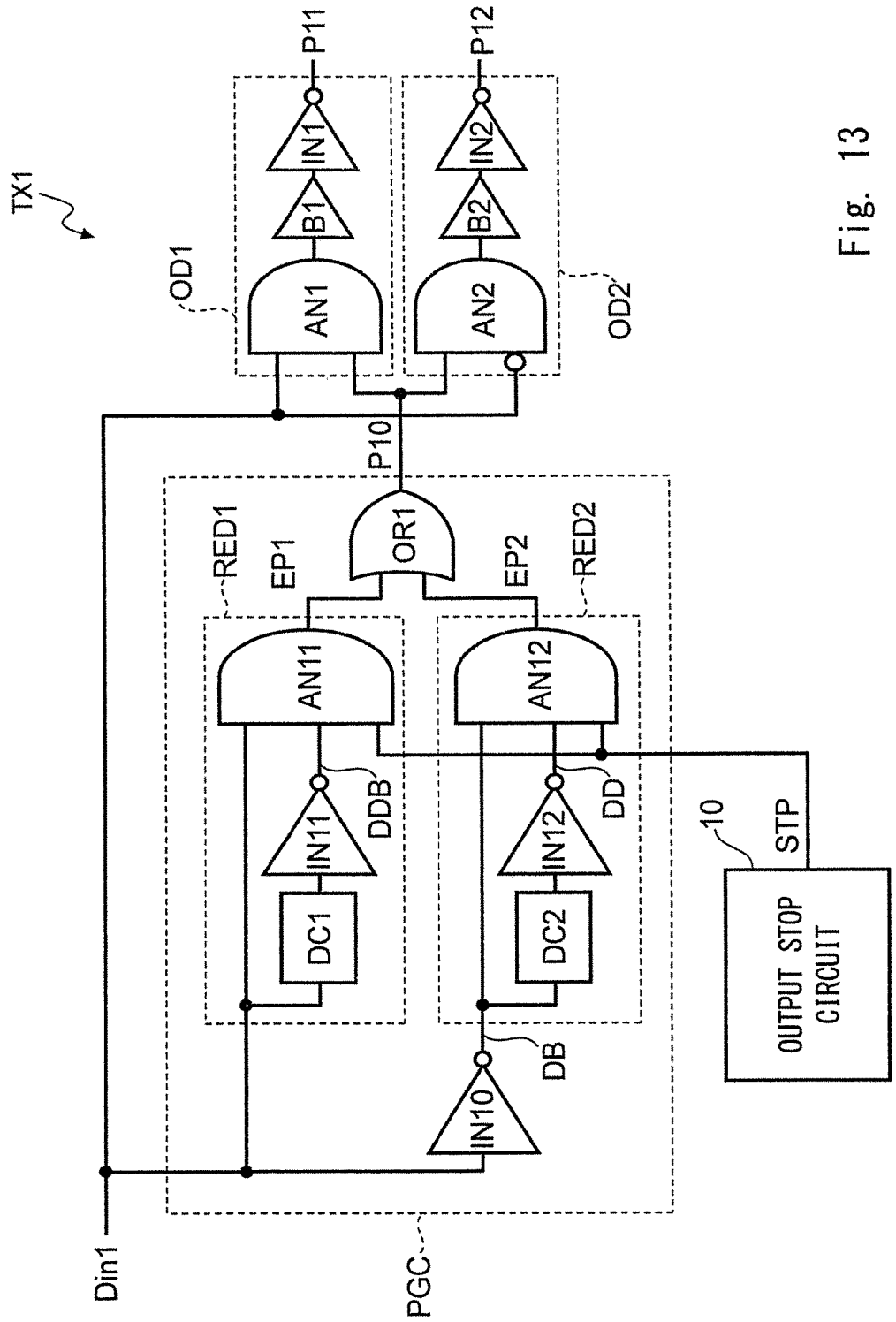
FIG. 13 is a circuit diagram showing Variation of the transmitter circuit TX1 according to the first embodiment.

FIGS. 12 and 13 are circuit diagrams showing Variations of the transmitter circuit TX1 according to the first embodiment.

In the transmitter circuit TX1 shown in FIG. 3, the stop signal STP is input to the AND gates AN1, AN2 respectively structuring the output drivers OD1, OD2.

On the other hand, in the transmitter circuit TX1 shown in FIG. 12, AND gates AN21, AN22 are provided at the front stage of the inverters IN1, IN2 respectively structuring the output drivers OD1, OD2, and the stop signal STP is input to the AND gates AN21, AN22.

Further, in the transmitter circuit TX1 shown in FIG. 13, the stop signal STP is input to the AND gates AN11, AN12 respectively structuring the rising edge detecting circuits RED1, RED2.

With the circuit structures shown in FIGS. 12 and 13 also, similarly to the circuit structure shown in FIG. 3, the output of the output pulse signal P11 and the output pulse signal P12 can be stopped for a prescribed period from when the power supply voltage VDD1 is turned on.

Note that, with the circuit structure shown in FIG. 13, generation of any erroneous pulses itself in the pulse signal P10 output from the pulse generating circuit PGC is suppressed.

<Variation of Pulse Generating Circuit PGC>

Figure 14:
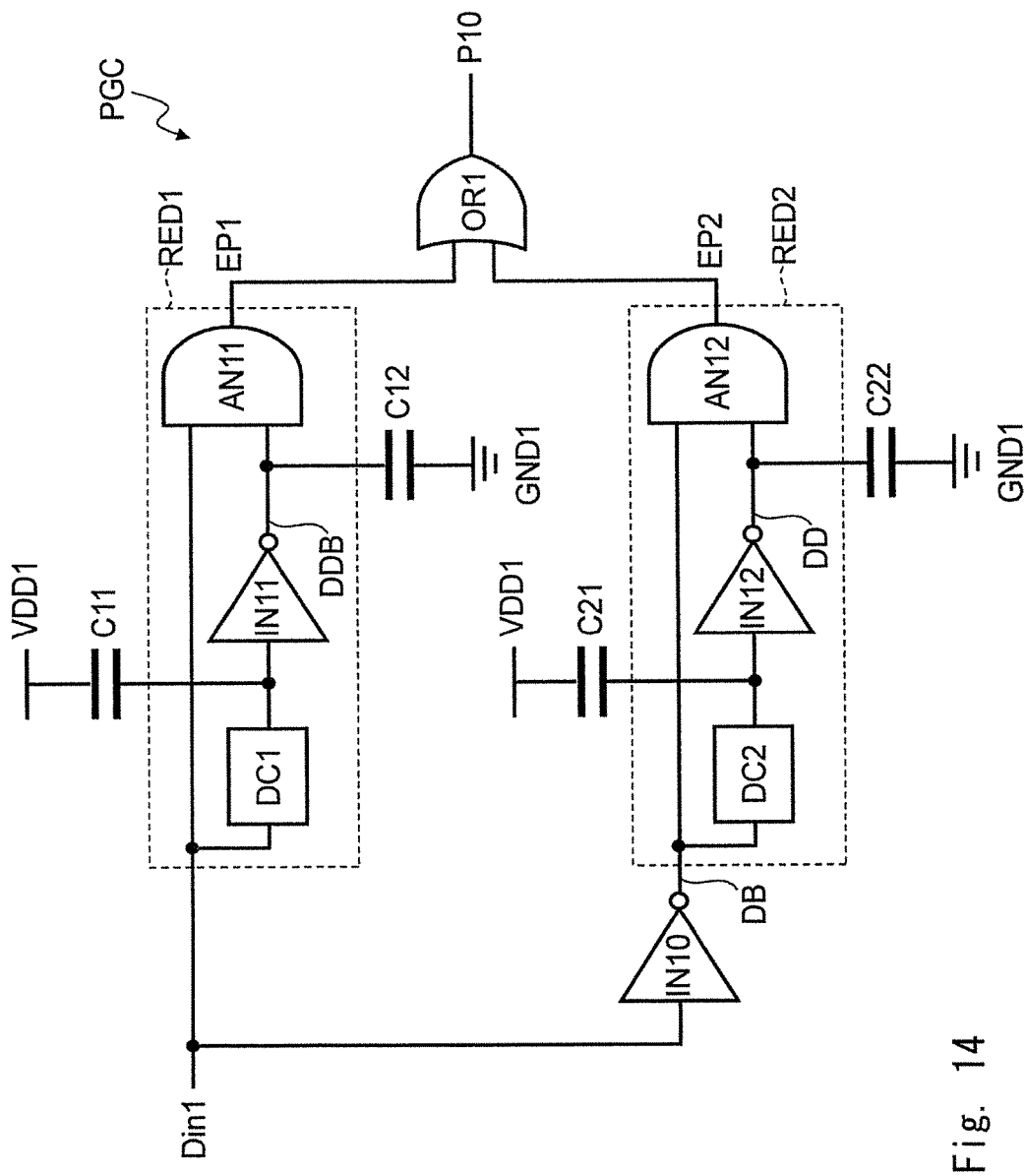
FIG. 14 is a circuit diagram showing Variation of the pulse generating circuit PGC according to the first embodiment.

FIG. 14 is a circuit diagram showing Variation of the pulse generating circuit PGC according to the first embodiment. In the pulse generating circuit PGC shown in FIG. 14, the outputs of the delay circuits DC1, DC2 are connected to the power supply respectively via capacitor elements C11, C21. Further, the outputs of the inverters IN11, IN12 are grounded respectively via capacitor elements C12, C22.

When the input data signal Din1 is L level when power supply voltage is turned on, the output of the AND gate AN11 becomes L level.

In this case, one input of the AND gate AN12 is the inverted data signal DB and therefore H level is attained. However, the output of the delay circuit DC2 is connected to the power supply via the capacitor element C21, and the output of the inverter IN12 is grounded via the capacitor element C22. Therefore, the output of the inverter IN12 being other input of the AND gate AN12 becomes constantly L level. Accordingly, the output of the AND gate AN12 also becomes L level.

When the input data signal Din1 is H level when the power supply voltage is turned on, one input of the AND gate AN11 becomes H level. However, the output of the delay circuit DC1 is connected to the power supply via the capacitor element C11, and the output of the inverter IN11 is grounded via the capacitor element C12. Therefore, the output of the inverter IN11 being other input of the AND gate AN11 becomes stably L level. Accordingly, the output of the AND gate AN11 becomes L level.

In this case, one input of the AND gate AN12 is the inverted data signal DB and therefore L level, and the output of the AND gate AN12 also becomes L level.

In this manner, with the pulse generating circuit PGC shown in FIG. 14, generation of erroneous pulses in the pulse signal P10 itself can be suppressed. Accordingly, by using such a pulse generating circuit PGC in combination with the output stop circuit 10, failure attributed to erroneous pulses generated at the electrostatic discharge damage test can be more effectively suppressed.

Note that, in the case where the delay circuits DC1, DC2 are structured by a plurality of inverters, it is preferable that the outputs of respective inverters are alternately connected to the power supply and the ground via capacitor elements.

(Second Embodiment)

<Structure of Output Stop Circuit 20>

Figure 15:
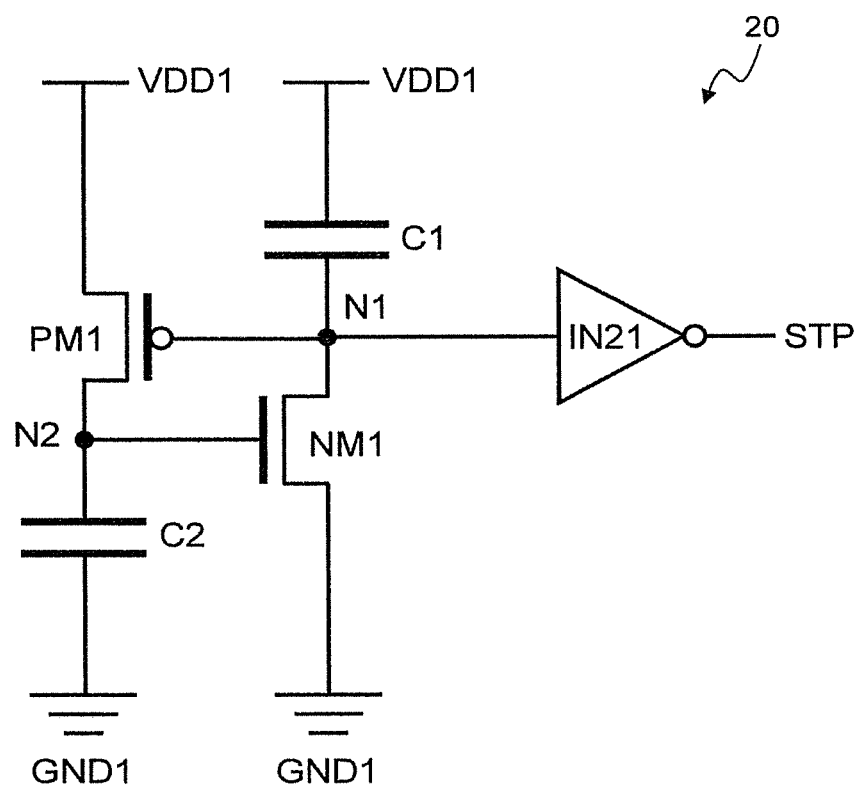
FIG. 15 is a circuit diagram showing one example of a specific circuit structure of an output stop circuit 20 according to the second embodiment.

Next, with reference to FIG. 15, a description will be given of a transmitter circuit TX1 according to a second embodiment. FIG. 15 is a circuit diagram showing one example of a specific circuit structure of an output stop circuit 20 according to the second embodiment. As shown in FIG. 15, the output stop circuit 20 includes an NMOS transistor NM1, a PMOS transistor PM1, capacitor elements C1, C2, and an inverter IN21. The structure of the transmitter circuit TX1 is similar to that of the transmitter circuit TX1 according to the first embodiment except for the output stop circuit 20.

In the output stop circuit 20, in place of the resistor element R1 in the output stop circuit 10 shown in FIG. 10, the off resistance of the NMOS transistor NM1 is used. The drain of the NMOS transistor NM1 whose source is grounded is connected to the power supply via the capacitor element C1. The drain of the NMOS transistor NM1 is connected to the input N1 of the inverter IN21.

On the other hand, the drain of the PMOS transistor PM1 whose source is connected to the power supply is grounded via the capacitor element C2. That is, the connection relationship between the PMOS transistor PM1 and the capacitor element C2 is inversion of the connection relationship between the NMOS transistor NM1 and the capacitor element C1 in terms of polarity. A gate N2 of the NMOS transistor NM1. is connected to the drain of the PMOS transistor PM1. Further, the gate of the PMOS transistor PM1 is connected to the drain of the NMOS transistor NM1 (that is, the input N1 of the inverter IN21).

Then, the stop signal STP is output from the inverter IN21.

<Operation of Output Stop Circuit 20>

Figure 16:
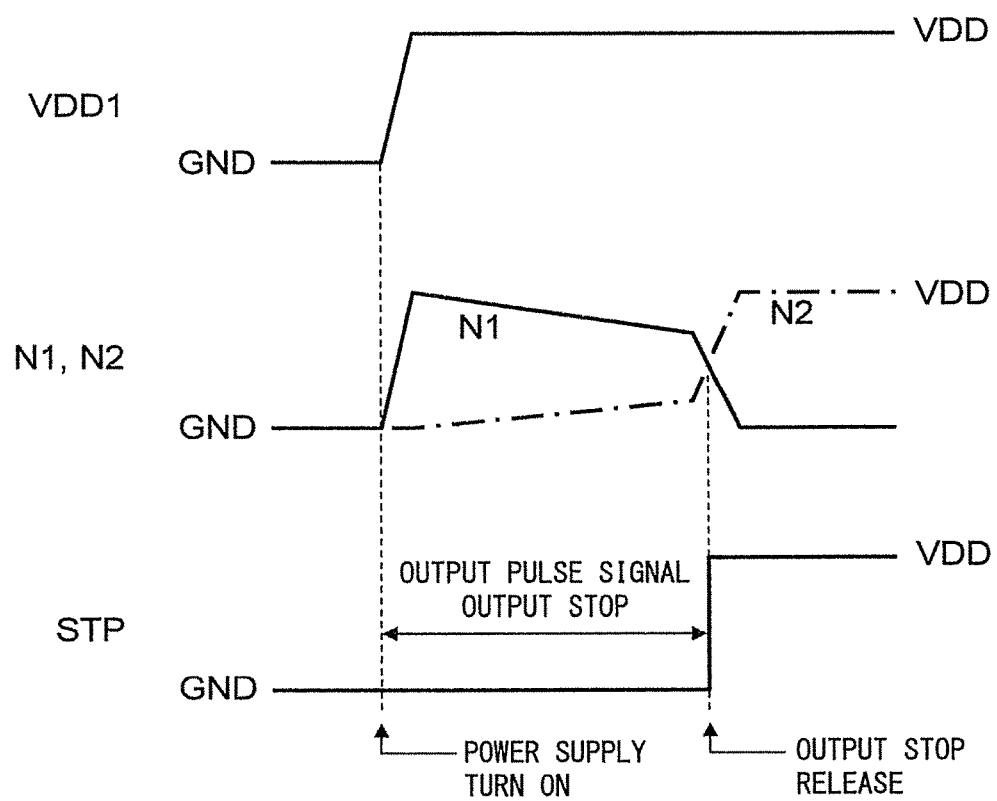
FIG. 16 is a timing chart for describing an operation of the output stop circuit 20 according to the second embodiment when the power supply voltage is turned on, FIG. 17 is a circuit diagram showing one example of a specific circuit structure of an output stop circuit 30 according to the third embodiment.

Next, with reference to FIG. 16, a description will be given of the operation of the output stop circuit 20 according to the second embodiment when the power supply voltage is turned on. FIG. 16 is a timing chart for describing the operation of the output stop circuit 20 according to the second embodiment when the power supply voltage is turned on. FIG. 16 shows, in order from the top, the power supply voltage VDD1, the voltages of the input N1 of the inverter IN21 (that is, the gate of the PMOS transistor PM1) and the gate N2 of the NMOS transistor NM1, and the stop signal STP.

As shown at the top level, when the power supply voltage VDD1 increases from the ground voltage GND to a specified voltage VDD in accordance with the power supply voltage VDD1 being turned on, as represented by a solid line at the second level, the voltage of the input N1 of the inverter IN21 connected to the power supply via the capacitor element C1 also increases to the specified voltage VDD. Accordingly, as shown at the third level, the stop signal STP being the output of the inverter IN21 becomes L level when the power supply voltage VDD1 is turned on.

When the power supply voltage VDD1 is turned on, since the voltage of the input N1 of the inverter IN21 (that is, the gate of the PMOS transistor PM1) is H level, the PMOS transistor PM1 is in the off state. Further, since the voltage of the gate N2 of the NMOS transistor NM1 is L level, the NMOS transistor NM1 is also in the off state.

As represented by a solid line at the second level, the voltage of the input N1 of the inverter IN21 gradually reduces by the off-leakage current of the NMOS transistor NM1. On the other hand, as represented by a dot-and-dash line at the second level, the voltage of the gate N2 of the NMOS transistor NM1 gradually increases by the off-leakage current of the PMOS transistor PM1.

When the input N1 of the inverter IN21 (that is, the gate of the PMOS transistor PM1) or the voltage of the gate N2 of the NMOS transistor NM1 reaches the threshold voltage, the NMOS transistor NM1 and the PMOS transistor PM1 enter the on state. Then, the voltage of the input N1 of the inverter IN21 is latched at L level, and the voltage of the gate N2 of the NMOS transistor NM1 is latched at H level.

In accordance therewith, as shown at the third level, the stop signal STP transits from L level to H level. During a period where the stop signal STP is L level, the output of the output pulse signals P11, P12 is stopped.

Similarly to the transmitter circuit TX1 according to the first embodiment, the transmitter circuit TX1 according to the second embodiment includes the output stop circuit 20 which stops output of the output pulse signal P11 and the output pulse signal P12 for a prescribed period from when the power supply voltage VDD1 is turned on. Therefore, output of erroneous pulses associated with turn-on of the power supply voltage VDD1 can be suppressed. An increase in the power supply voltage VDD1 at the electrostatic discharge damage test is a physical phenomenon which is similar to turn-on of the power supply voltage VDD1. Accordingly, at the electrostatic discharge damage test also, the output stop circuit 20 activates and any failure attributed to erroneous pulses associated with an increase in the power supply voltage VDD1 can be suppressed.

Meanwhile, with the output stop circuit 10 according to the first embodiment, the stop period is determined by the time constant of the resistor element R1 and the capacitor element C1. Accordingly, in order to secure a stop period of several is, the resistor element R1 and the capacitor element C1 must be great in size, and an increase in the chip area is invited.

On the other hand, with the output stop circuit 20 according to the second embodiment, the off resistance of the NMOS transistor NM1 is used in place of the resistor element R1. Therefore, the resistance value can be increased with the NMOS transistor NM1 being small in size, and the capacitor element C1 can also be reduced in size. Similarly, the PMOS transistor PM1 and the capacitor element C2 can also be reduced in size. Accordingly, as compared to the output stop circuit 10 according to the first embodiment, while the number of elements increases, the chip area as a whole can be reduced.

Further, with the output stop circuit 20 according to the second embodiment, after the output stop is released, the stop signal STP can be maintained at H level by the on resistance of the NMOS transistor NM1 and the PMOS transistor PM1. Accordingly, the noise immunity in the normal operation improves.

(Third Embodiment)

<Structure of Output Stop Circuit 30>

Figure 17:
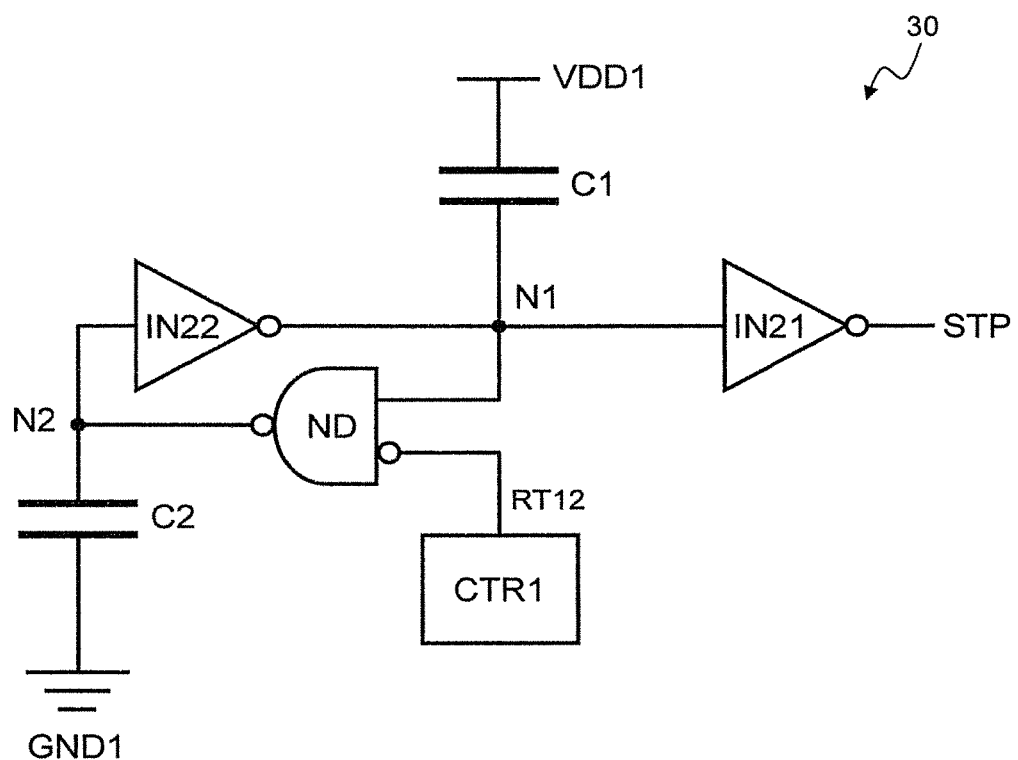

Next, with reference to FIG. 17, a description will be given of a transmitter circuit TX1 according to a third embodiment. FIG. 17 is a circuit diagram showing one example of a specific circuit structure of an output stop circuit 30 according to the third embodiment. As shown in FIG. 17, the output stop circuit 30 includes an NAND gate ND, capacitor elements C1, C2, inverters IN21, IN22, and a counter CTR1. The structure of the transmitter circuit TX1 is similar to the transmitter circuit TX1 according to the first embodiment except for the output stop circuit 30.

An input N2 of the inverter IN22 is grounded via the capacitor element C2. The output of the inverter IN22 is connected to the power supply via the capacitor element C1. The output of the inverter IN22 is connected to an input N1 of the inverter IN21.

Further, the output of the inverter IN22 (that is, the input N1 of the inverter IN21) is input to the NAND gate ND. The output of the NAND gate ND is connected to the input N2 of the inverter IN22. That is, by the inverter IN22 and the NAND gate ND, a latch circuit is structured.

In other words, the storage node N1 of the latch circuit is connected to the power supply via the capacitor element C1, and the storage node N2 is grounded via the capacitor element C2. The storage nodes N1, N2 of the latch circuit respectively retain voltages being inverted from each other.

To the NAND gate ND, an inverted signal of a regular request signal RT12 output from the counter CTR1 is input.

Then, the stop signal STP is output from the inverter IN21.

Note that, the regular request signal RT12 is, for example, an H-active pulse signal which is regularly output after the power supply voltage VDD1 is turned on. However, the signal output from the counter CTR1 may be an H-active pulse signal which is output just once after a lapse of a prescribed time from when the power supply voltage VDD1 is turned on, or may be an enable signal which transits from L level to H level and maintains H level. Further, while the logic of the enable signal is similar to the stop signal STP, it may change to L level unintentionally, for example by a change in temperatures. As will be detailed later, in such a case also, the value of the stop signal STP is stably retained at H level by the latch circuit.

<Operation of Output Stop Circuit 30>

Figure 18:
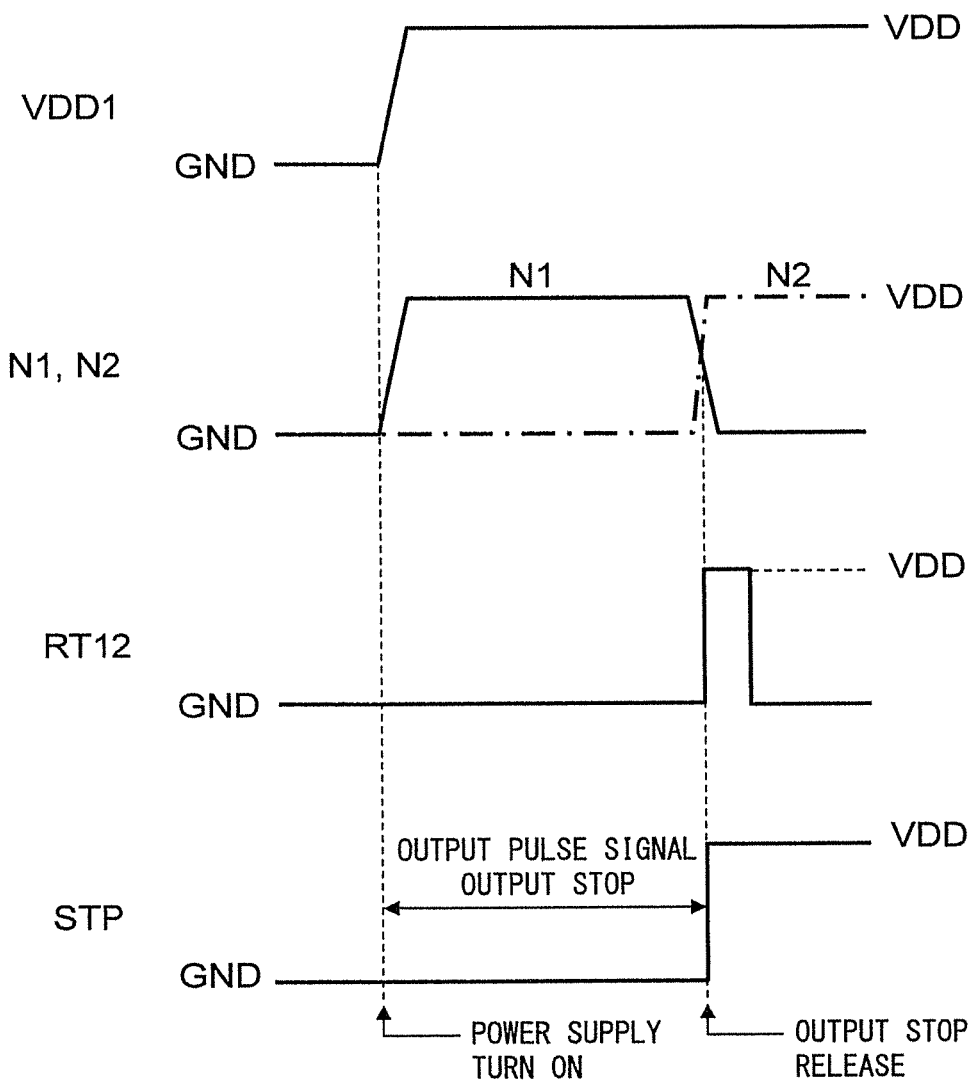
FIG. 18 is a timing chart for describing an operation of the output stop circuit 30 according to the third embodiment when the power supply voltage is turned on, FIG. 19 is a block diagram showing a structure of the semiconductor apparatus system 2 according to the third embodiment.

Next, with reference to FIG. 18, a description will be given of the operation of the output stop circuit 30 according to the third embodiment when the power supply voltage is turned on. FIG. 18 is a timing chart for describing the operation of the output stop circuit 30 according to the third embodiment when the power supply voltage is turned on. FIG. 18 shows, in order from the top, the power supply voltage VDD1, the voltages of the storage nodes N1, N2, the regular request signal RT12, and the stop signal STP.

As shown at the top level, when the power supply voltage VDD1 increases from the ground voltage GND to a specified voltage VDD in accordance with turn-on of the power supply voltage, as represented by a solid line at the second level, the voltage of the storage node N1 connected to the power supply via the capacitor element C1 also increases to the specified voltage VDD. Accordingly, as shown at the third level, the stop signal STP being the output of the inverter IN21 becomes L level when the power supply voltage VDD1 is turned on.

After the power supply voltage VDD1 is turned on, as represented by a solid line at the second level, the voltage of the storage node N1 of the latch circuit structured by the inverter IN22 and the NAND gate ND is retained at H level. On the other hand, as represented by a dot-and-dash line at the second level, the voltage of the storage node N2 of the latch circuit is retained at L level.

As shown at the third level, after a lapse of a prescribed time period from when the power supply voltage VDD1 is turned on, when the regular request signal RT12 temporarily becomes H level, the voltage of the storage node N2 transits to H level. Therefore, the voltage of the storage node N1 transits to L level. Then, by the inverter IN22 and the NAND gate ND, the voltage of the storage node N1 is latched at L level and the voltage of the storage node N2 is latched at H level. This state is maintained irrespective of the signal level of the regular request signal RT12.

In accordance therewith, as shown at the fourth level, the stop signal STP transits from L level to H level. During a period where the stop signal STP is L level, the output of the output pulse signals P11, P12 is stopped. When the stop signal STP switches to H level, the output stop of the output pulse signals P11, P12 is released.

In this manner, the latch circuit structured by the inverter IN22 and the NAND gate ND senses activation of the power supply voltage, and maintains the stop signal STP at L level. Then, the latch circuit switches the stop signal STP to H level in accordance with the regular request signal RT12 output from the counter CTR1 being a timer.

Similarly to the transmitter circuit TX1 according to the first embodiment, the transmitter circuit TX1 according to the third embodiment includes the output stop circuit 30 which stops output of the output pulse signal P11 and the output pulse signal P12 for a prescribed period from when the power supply voltage VDD1 is turned on. Therefore, output of erroneous pulses associated with turn-on of the power supply voltage VDD1 can be suppressed. An increase in the power supply voltage VDD1 at the electrostatic discharge damage test is a physical phenomenon which is similar to turn-on of the power supply voltage VDD1. Accordingly, at the electrostatic discharge damage test also, the output stop circuit 30 activates and any failure attributed to erroneous pulses associated with an increase in the power supply voltage VDD1 can be suppressed.

With the output stop circuit 30 according to the third embodiment, since the stop period is determined by the counter CTR1 being a timer, variations in the stop period can be reduced. Further, since the capacitor elements C1, C2 do not contribute to the stop period, a reduction in size can be achieved. For example, the size can be further reduced by using the gate capacity of the transistors as the capacitor elements C1, C2. Further, it is not necessary to newly provide a timer and the existing element can be used. Accordingly, the chip area can be reduced as a whole.

Further, since the stop signal STP is latched to H level by the inverter IN22 and the NAND gate ND after the output-stop release, excellent noise immunity in the normal operation is exhibited.

<Structure of Semiconductor Apparatus System 2>

Figure 19:
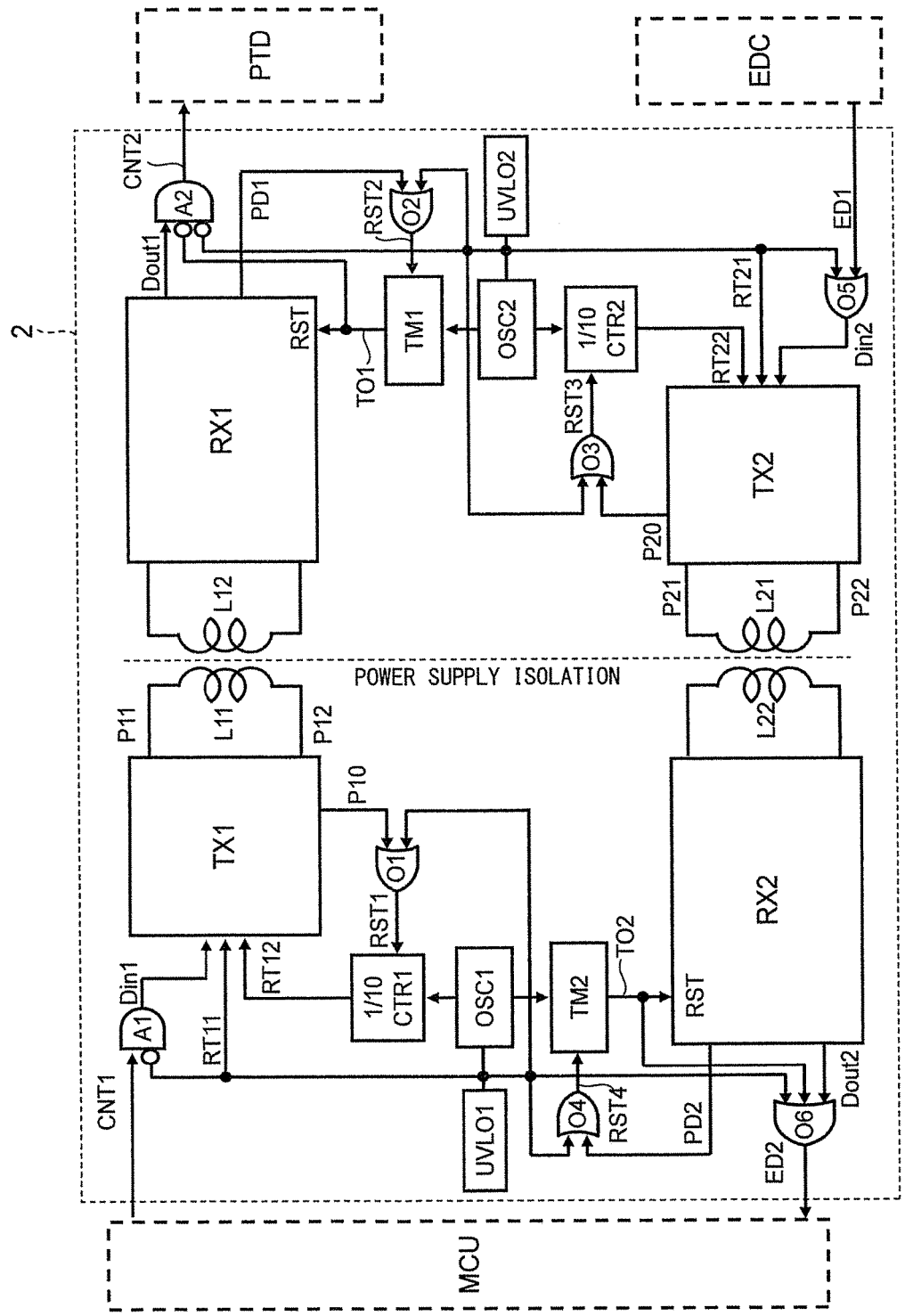

Next, with reference to FIG. 19, a description will be given of a semiconductor apparatus system 2 using the transmitter circuit TX1 according to the third embodiment. FIG. 19 is a block diagram showing the structure of the semiconductor apparatus system 2 according to the third embodiment. The semiconductor apparatus system 2 according to the third embodiment includes two transmitter circuits TX1, TX2, primary coils L11, L21, secondary coils L12, L22, two receiver circuits RX1, RX2, two oscillator circuits OSC1, OSC2, two counters CTRL, CTR2, two timers TM1, TM2, two under voltage lockout (UVLO) circuits UVLO1, UVLO2, two AND gates A1, A2, and six OR gates O1 to O6.

Here, the transmitter circuits TX1, TX2 are similarly structured as the transmitter circuit TX1 according to first embodiment having been described with reference to FIG. 3. Here, the transmitter circuits TX1, TX2 each include the output stop circuit 30 according to the third embodiment shown in FIG. 17. Further, the receiver circuits RX1, RX2 are similarly structured as the receiver circuit RX1 according to the first embodiment having been described with reference to FIG. 5. The semiconductor apparatus system 2 according to the third embodiment is an example of a micro-isolator applied to a control system of a power transistor.

Firstly, the substantial structure and flow of signals will be described.

A control signal CNT1 output from a microcomputer MCU is input to the transmitter circuit TX1 as an input data signal Din1. Further, to the transmitter circuit TX1, an irregular request signal RT11 output from the UVLO circuit UVLO1 and a regular request signal RT12 output from the counter CTR1 are also input.

The output pulse signals P11, P12 output from the transmitter circuit TX1 are transmitted to the receiver circuit RX1 via the primary coil L11 and the secondary coil L12. The receiver circuit RX1 reconstructs a data signal from the received signals, and outputs as an output data signal Dout1. The output data signal Dout1 is input to a power transistor driver PTD as a control signal CNT2.

That is, the control signal CNT1 output from the microcomputer MCU is input to the power transistor driver PTD as the control signal CNT2 via the transmitter circuit TX1 and the receiver circuit RX1.

On the other hand, an error detection signal ED1 output from an error detecting circuit EDC is input to the transmitter circuit TX2 as an input data signal Din2. Further, to the transmitter circuit TX2, an irregular request signal RT21 output from UVLO circuit UVLO2 and a regular request signal RT22 output from the counter CTR2 are also input.

The output pulse signals P21, P22 output from the transmitter circuit TX2 are transmitted to the receiver circuit RX2 via the primary coil L21 and the secondary coil L22. The receiver circuit RX2 reconstructs a data signal from the received signals, and outputs as an output data signal Dout2. The output data signal Dout2 is input to the microcomputer MCU as an error detection signal ED2.

That is, the error detection signal ED1 output from the error detecting circuit EDC is input to the microcomputer MCU as the error detection signal ED2 via the transmitter circuit TX2 and the receiver circuit RX2.

<Details of Semiconductor Apparatus System 2>

In the following, detailed structure and flow of signals will be described.

The control signal CNT1 output from the microcomputer MCU is input to the transmitter circuit TX1 via the AND gate A1 as the input data signal Din1. Here, to the AND gate A1, an inverted signal of the irregular request signal RT11 output from the UVLO circuit UVLO1 is also input.

The irregular request signal RT11 is L level in the normal state, and becomes H level in the abnormal state where the power supply voltage reduces. That is, in the normal state where the irregular request signal RT11 is L level, the control signal CNT1 output from the microcomputer MCU is input to the transmitter circuit TX1 as the input data signal Din1. On the other hand, in the abnormal state where the irregular request signal RT11 is H level, by the AND gate A1, the input of the control signal CNT1 output from the microcomputer MCU to the transmitter circuit TX1 is blocked.

Further, the irregular request signal RT11 is also input to the transmitter circuit TX1. At the timing where the irregular request signal RT11 transits from L level to H level or from H level to L level, the value of the input data signal Din1 (the control signal CNT1) is re-transmitted from the transmitter circuit TX1 to the receiver circuit RX1. That is, not only when the power supply voltage reduces, but also at the timing where the power supply voltage increases by being turned on and transits to the normal value, the value of the data signal on the transmission side and the value of the data signal on the reception side are synchronized.

The regular request signal RT12 output from the counter CTR1 is input to the transmitter circuit TX1. The regular request signal RT12 is a signal which becomes H level, for example, every 10 counts of the clock signal output from the oscillator circuit OSC1. For example, when a clock signal of 10 MHz is output from the oscillator circuit OSC1, the counter CTRL generates the regular request signal RT12 of 1 µs-cycle (1 MHz). By the regular request signal RT12, even when there are no changes in the data value, the data value is re-transmitted every 10 counts. Therefore, even when the data value reconstructed by the receiver circuit RX1 is inverted by noises or the like, the correct value can be quickly recovered.

Further, as described above, the regular request signal RT12 output from the counter CTR1 is input to the NAND gate ND of the output stop circuit 30 according to the third embodiment shown in FIG. 17.

The counter CTR1 is reset by the pulse signal P10 or the irregular request signal RT11 output from the UVLO circuit UVLO1. That is, the counter CTR1 is reset by a reset signal RST1 output from the OR gate O1 whose inputs are the pulse signal P10 and the irregular request signal RT11.

The transmitter circuit TX1 outputs the output pulse signals P11, P12 based on the input data signal Din1. The output pulse signals P11, P12 are input to the receiver circuit RX1 via the primary coil L11 and the secondary coil L12. The receiver circuit RX1 reconstructs the data signal and outputs as the output data signal Dout1. Note that, details are as described in the first embodiment.

The output data signal Dout1 is input to the power transistor driver PTD via the AND gate A2. Here, to the AND gate A2, an inverted signal of the irregular request signal RT21 output from the UVLO circuit UVLO2 is input. Further, to the AND gate A2, an inverted signal of a timeout signal TO1 output from the timer TM1 is input.

The irregular request signal RT21 is L level in the normal state, and becomes H level when the power supply voltage reduces. Further, the timeout signal TO1 is also L level in the normal state, and becomes H level when the pulse detection signal PD1 is not detected after a lapse of prescribed counts (for example, 40 counts). That is, in the normal state where the irregular request signal RT21 and the timeout signal TO1 are L level, the output data signal Dout1 is input to the power transistor driver PTD. On the other hand, when the irregular request signal RT21 or the timeout signal TO1 switches to H level, by the AND gate A2, input of the output data signal Dout1 to the power transistor driver PTD is blocked. Further, the timeout signal TO1 resets the receiver circuit RX1. Note that, in the normal operation mode, the data value is re-transmitted every 10 counts from the transmitter circuit TX1 by the regular request signal RT12, and the pulse detection signal PD1 is output from the receiver circuit RX1. Therefore, the timer TM1 will not reach 40 counts. On the other hand, in the case where the transmitter circuit TX1 stops or the like, the timeout signal TO1 is output. By the regular request signal RT12, an abnormality in the operation of the transmitter circuit TX1 can be detected.

Here, the timer TM1 counts the clock signal output from the oscillator circuit OSC2. Further, the timer TM1 is reset by the pulse detection signal PD1 output from the receiver circuit RX1 or the irregular request signal RT21 output from the UVLO circuit UVLO2. That is, the timer TM1 is reset by a reset signal RST2 output from the OR gate O2 whose inputs are the pulse detection signal PD1 and the irregular request signal RT21.

On the other hand, the error detection signal ED1 output from the error detecting circuit EDC is input to the transmitter circuit TX2 via the OR gate O5 as the input data signal Din2. The error detection signal ED1 is L level in the normal state, and becomes H level in the abnormal state where any error is detected. Here, to the OR gate O5, the irregular request signal RT21 output from the UVLO circuit UVLO2 is also input. The irregular request signal RT21 is L level in the normal state, and becomes H level in the abnormal state where the power supply voltage reduces.

That is, the irregular request signal RT21 is input also as an error signal to the transmitter circuit TX2 together with the error detection signal ED1.

Further, the irregular request signal RT21 is also input to the transmitter circuit TX2. At the timing where the irregular request signal RT21 transits from L level to H level or from H level to L level, the value of the input data signal Din2 is re-transmitted from the transmitter circuit TX2 to the receiver circuit RX2. That is, not only when the power supply voltage reduces, but also at the timing where the power supply voltage increases by being turned on and transits to the normal value, the value of the data signal on the transmission side and the value of the data signal on the reception side are synchronized.

Further, the regular request signal RT22 output from the counter CTR2 is input to the transmitter circuit TX2. The regular request signal RT22 is a signal which becomes H level, for example, every 10 counts of the clock signal output from the oscillator circuit OSC2. By the regular request signal RT22, even when there are no changes in the data value, the data value is re-transmitted every 10 counts. Therefore, even when the data value reconstructed by the receiver circuit RX2 is inverted by noises or the like, the correct value can be quickly recovered.

Further, the counter CTR2 is reset by the pulse signal P20 or the irregular request signal RT21 output from the UVLO circuit UVLO2. That is, the counter CTR2 is reset by a reset signal RST3 output from the OR gate O3 whose inputs are the pulse signal P20 and the irregular request signal RT21.

The transmitter circuit TX2 outputs the output pulse signals P21, P22 based on the input data signal Din2. The output pulse signals P21, P22 are input to the receiver circuit RX2 via the primary coil L21 and the secondary coil L22. The receiver circuit RX2 reconstructs the data signal and outputs as the output data signal Dout2.

The output data signal Dout2 is input to the microcomputer MCU via the OR gate O6. Here, to the OR gate O6, the irregular request signal RT11 output from the UVLO circuit UVLO1 is input. Further, to the OR gate O6, a timeout signal TO2 output from the timer TM2 is input. That is, the irregular request signal RT11 and the timeout signal TO2 are input as an error detection signal ED2 to the microcomputer MCU together with the output data signal Dout2

Here, the timeout signal TO2 is L level in the normal state, and becomes H level when the pulse detection signal PD2 is not detected after a lapse of prescribed counts (for example, 40 counts). Further, the timeout signal TO2 resets the receiver circuit RX2. Note that, in the normal operation mode, the data value is re-transmitted every 10 counts from the transmitter circuit TX2 by the regular request signal RT22, and the pulse detection signal PD2 is output from the receiver circuit RX2. Therefore, the timer TM2 will not reach 40 counts. On the other hand, in the case where the transmitter circuit TX2 stops or the like, the timeout signal TO2 is output. By the regular request signal RT22, an abnormality in the operation of the transmitter circuit TX2 can be detected.

Here, the timer TM2 counts the clock signal output from the oscillator circuit OSC1. Further, the timer TM2 is reset by the pulse detection signal PD2 output from the receiver circuit RX2 or the irregular request signal RT11 output from the UVLO circuit UVLO1. That is, the timer TM2 is reset by a reset signal RST4 output from the OR gate O4 whose inputs are the pulse detection signal PD2 and the irregular request signal RT11.

<Exemplary Application of Semiconductor Apparatus System 2>

The control target of the semiconductor apparatus system 2 is, for example, a power transistor represented by an insulated gate bipolar transistor (IGBT). In this case, the semiconductor apparatus system 2 controls ON/OFF of the power transistor in accordance with the output data signal Dout1 reproduced by the receiver circuit RX1, to control the conduction state between the power supply and the load.

Figure 20:
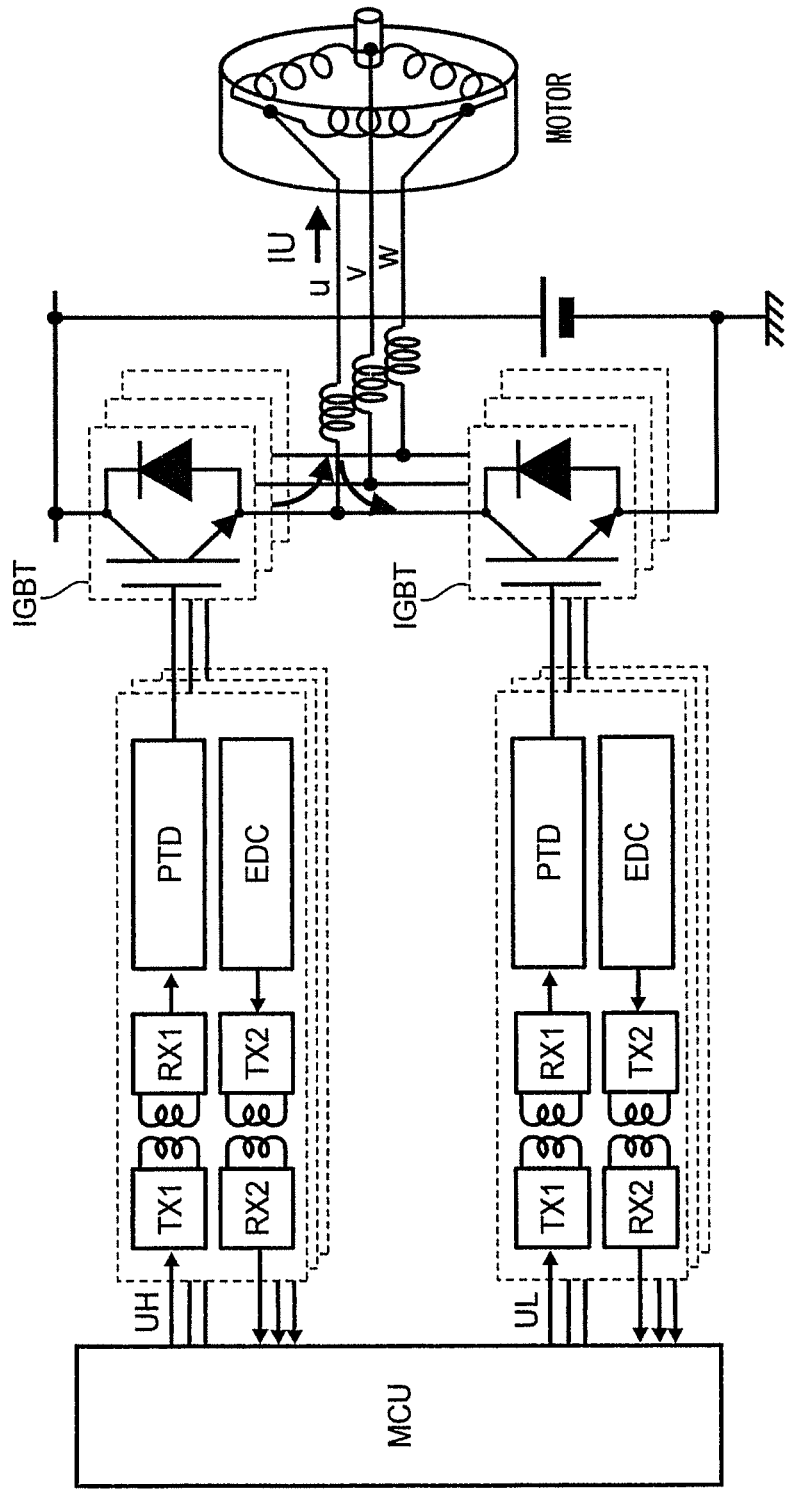
FIG. 20 is a diagram showing an inverter apparatus to which the semiconductor apparatus system 2 is applied.

Specifically, the semiconductor apparatus system 2 according to the third embodiment is applied to, for example, an inverter apparatus which drives a three-phase motor (the load) as shown in FIG. 20. FIG. 20 is a diagram showing the inverter apparatus to which the semiconductor apparatus system 2 is applied. The inverter apparatus shown in FIG. 20 includes, on each of the high side and the low side, three power transistor drivers PTD and three error detecting circuits EDC respectively corresponding to the u-phase, the v-phase, and the w-phase (six in total).

Control signals (for example, UH, UL) output from the microcomputer MCU are transmitted to the power transistor drivers PTD via the transmitter circuits TX1, coils, and the receiver circuits RX1, and ON/OFF of the IGETs being the control targets is controlled. On the other hand, error signals detected by the error detecting circuits EDC are transmitted to the microcomputer MCU via the transmitter circuits TX2, the coils, and the receiver circuits RX2.

Figure 21:
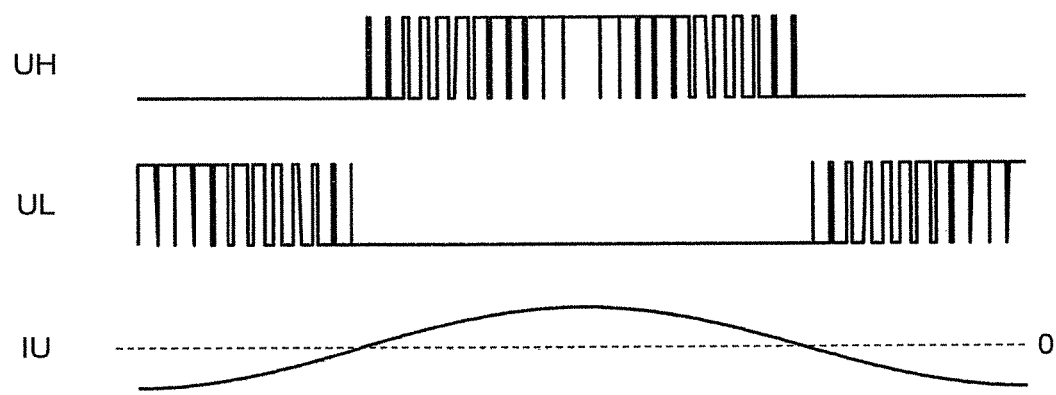
FIG. 21 is a timing chart showing an operation of the inverter apparatus to which the semiconductor apparatus system 2 is applied.

Here, FIG. 21 is a timing chart showing the operation of the inverter apparatus to which the semiconductor apparatus system 2 is applied. As shown in the graph of FIG. 21, the control signals (for example, UH, UL) output from the microcomputer MCU are PWM control signals, and the current (for example, IU) flowing through the motor is controlled in an analog manner. Here, the control signals (for example, UH, UL) correspond to the input data signal Din1.

(Other Embodiment)

Figure 22:
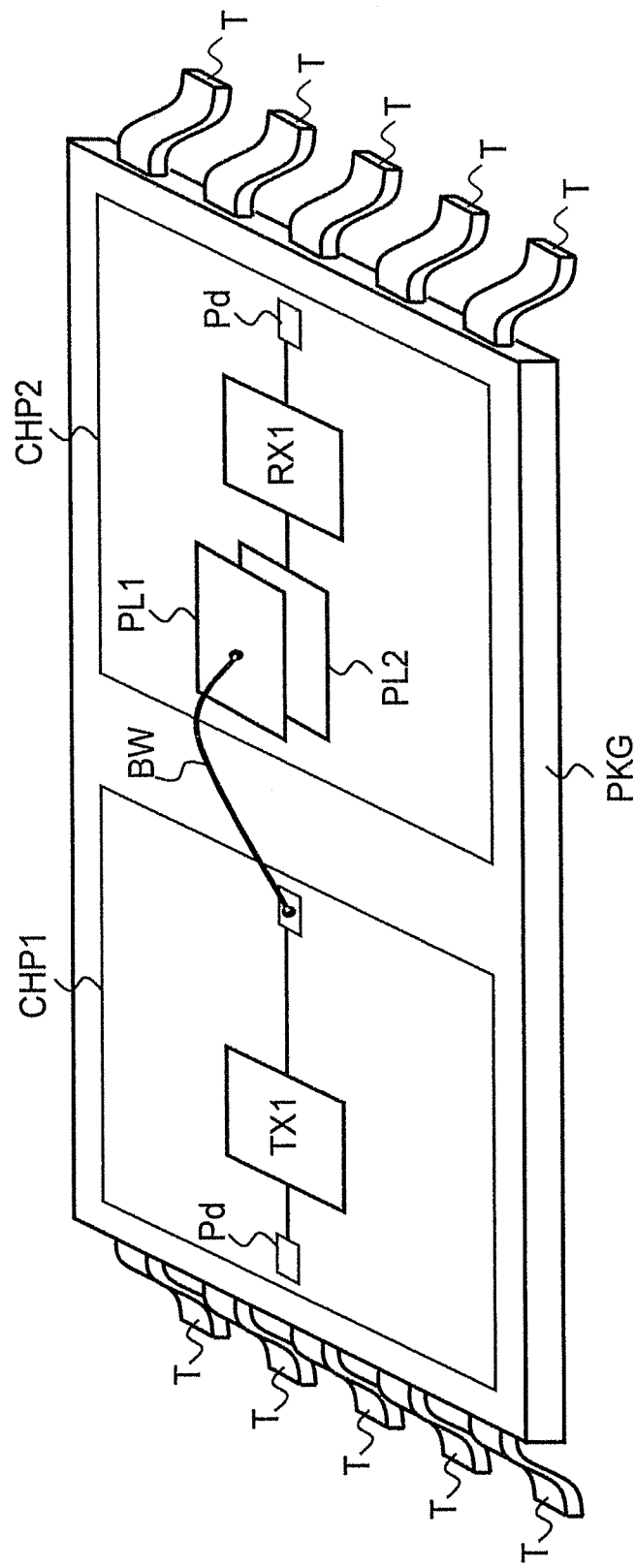
FIG. 22 is amounting example of the semiconductor apparatus in the case where a capacitor is used as the insulating coupling element.
Figure 23:
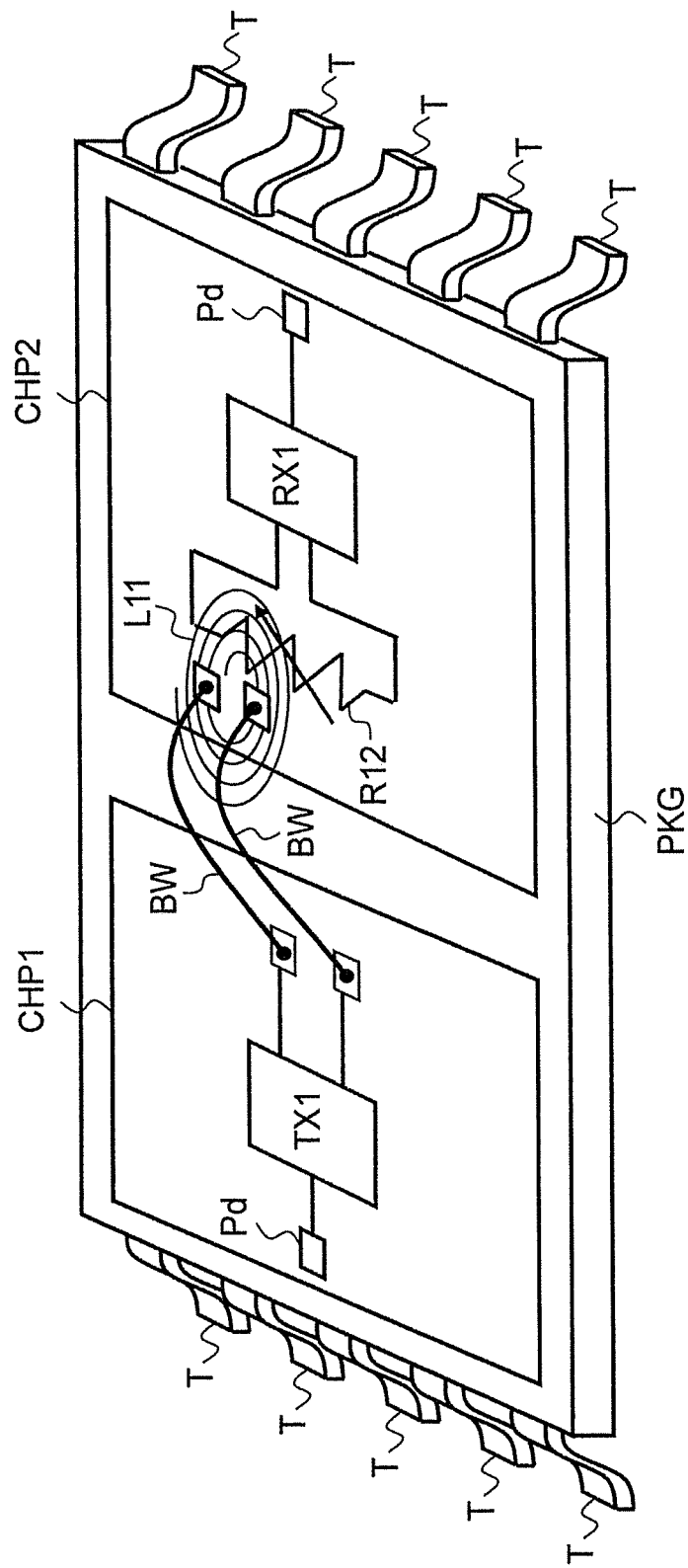
FIG. 23 is amounting example of the semiconductor apparatus where a GMR element is used as the insulating coupling element.

The mounting example of the semiconductor apparatus is not limited to that shown in FIG. 2. In the following, with reference to FIGS. 22 and 23, other representative mounting examples of the semiconductor apparatus are described. FIG. 22 is a mounting example of the semiconductor apparatus in the case where a capacitor is used as the insulating coupling elements. FIG. 23 shows a mounting example of the semiconductor apparatus where a GMR (Giant Magneto Resistive) element is used as the insulating coupling element.

In FIG. 22, the coils used as the insulating coupling elements in the mounting example shown in FIG. 2 are replaced by a capacitor. More specifically, the primary coil L11 is replaced by one electrode PL1 of a capacitor, and the secondary coil L12 is replaced by other electrode PL2 of the capacitor.

In FIG. 23, the coils used as the insulating coupling elements in the mounting example shown in FIG. 2 are replaced by a GMR (Giant Magneto Resistive) element. More specifically, while the primary coil L11 remains intact, the secondary coil L12 is replaced by a GMR element R12. In this mounting example also, pads connected to the outputs of the transmitter circuit TX1 are formed at the semiconductor chip CHP1, and pads respectively connected to the opposite ends of the primary coil L11 are formed at the semiconductor chip CHP2. Then, the transmitter circuit TX1 is connected to the primary coil L11 formed at the semiconductor chip CHP2 via the pads and bonding wires BW.

As described above, the type and arrangement of the insulating coupling elements are not particularly limited. Note that, while it has been described that the insulating coupling elements are formed on the semiconductor chip, the insulating coupling elements may be formed as an externally attached component.

In the foregoing, while the invention made by the inventor has been specifically described based on the embodiments, the present invention is not limited to the embodiments described above, and it goes without saying that various changes can be made within a range not deviating from the spirit of the present invention.

For example, with the semiconductor apparatus according to the embodiments, the conductivity type (p-type or n-type) of the semiconductor substrate, the semiconductor layer, the diffusion layer (the diffusion region) and the like may be inverted. Therefore, in the case where one conductivity type of n-type and p-type is the first conductivity type and other conductivity type is the second conductivity type, the first conductivity type may be p-type, and the second conductivity type may be n-type. Contrarily, the first conductivity type may be n-type, and the second conductivity type may be p-type.

The first to third and other embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A transmitter circuit comprising:
    a pulse generating circuit generating a pulse signal based on edges of input data;
    a first output driver outputting, based on the pulse signal, a first output pulse signal according to one of the edges to a first end of an external insulating coupling element;
    a second output driver outputting, based on the pulse signal, a second output pulse signal according to the other one of the edges to a second end of the insulating coupling element; and
    an output stop circuit stopping the first and second output pulse signals from being output for a prescribed period from when a power supply voltage is turned on, wherein
    the output stop circuit includes:
    a first capacitor element connected between a power supply and a first node;
    a first transistor connected between the first node and a ground;
    a second transistor connected between the power supply and a second node; and
    a second capacitor element connected between the second node and the ground, wherein
    a gate of the first transistor is connected to the second node and a gate of the second transistor is connected to the first node, and
    the stop of the output of the first and second output pulse signals is released in accordance with a voltage of the first node and a voltage of the second node.

2. The transmitter circuit according to claim 1, wherein the first transistor is an N-type transistor and the second transistor is a P-type transistor.

3. The transmitter circuit according to claim 2, wherein
    a source of the first transistor is connected to the ground and a drain of the first transistor is connected to the first node, and
    a source of the second transistor is connected to the power supply and a drain of the second transistor is connected to the second node.

* * * * *